United States Patent [19]

Hayakawa et al.

[11] Patent Number: 4,894,680
[45] Date of Patent: Jan. 16, 1990

[54] IMAGE RECORDING APPARATUS

[75] Inventors: Kiyoharu Hayakawa, Ama; Yumio Matsumoto, Kasugai; Masashi Ueda, Nagoya; Akira Sago, Nagoya; Osamu Takagi, Nagoya, all of Japan

[73] Assignee: Brother Kogyo Kabushiki Kaisha, Japan

[21] Appl. No.: 203,318

[22] Filed: Jun. 6, 1988

[30] Foreign Application Priority Data

Jun. 8, 1987 [JP] Japan .................................. 62-88462
Jun. 12, 1987 [JP] Japan .................................. 62-91191
Jun. 15, 1987 [JP] Japan .................................. 62-91497
Dec. 15, 1987 [JP] Japan .................................. 62-191009

[51] Int. Cl.⁴ ........................ G03B 27/32; G03B 27/52
[52] U.S. Cl. ......................................... 355/18; 355/27; 355/290
[58] Field of Search ................ 355/18, 27, 3 FU, 289, 355/290; 156/540, 555; 430/138; 250/317.1, 318, 319; 219/216

[56] References Cited

U.S. PATENT DOCUMENTS 3,158,523 11/1964 Morrow ............................ 355/27 X
4,399,209 8/1983 Sanders et al. ...................... 430/138
4,716,435 12/1987 Wilson .............................. 355/3 FU
4,745,431 5/1988 Kogure et al. ..................... 355/3 FU
4,748,475 5/1988 Ishiyama et al. ...................... 355/27
4,760,426 7/1988 Taniguchi et al. ..................... 355/27

Primary Examiner—L. T. Hix
Assistant Examiner—Brian W. Brown
Attorney, Agent, or Firm—Kane, Dalsimer, Sullivan, Kurucz, Levy, Eisele and Richard

[57] ABSTRACT

In an image recording apparatus, a housing is provided in its wall with an external insertion opening. A pair of heat-treatment rollers are arranged within the housing. A first predetermined transport path extends through a nip between the heat-treatment rollers. The developing sheet having carried thereon an image is transported along the first transport path and is heat-treated by the heat-treatment rollers. A second predetermined transport path different from the first transport path extends through the nip between the heat-treatment rollers. An article inserted through the external insertion opening can travel along the second transport path so that the article is heat-treated by the heat-treatment rollers. Preferably, the heat-treatment rollers are arranged at an upper location within the housing, and the wall provided therein with the external insertion opening is a top wall of the housing.

58 Claims, 16 Drawing Sheets

IMAGE RECORDING APPARATUS

BACKGROUND OF THE INVENTION

This invention relates to an image recording apparatus which utilizes a developing sheet.

Conventionally, various types of image recording apparatuses have already been known from, for example, U.S. Pat. No. 4,399,209 and the like, in which a photo and pressure sensitive recording medium is subjected to predetermined exposure processing, and the photo and pressure sensitive recording medium and a developing sheet superposed one upon the other are pressurized to develop a latent image on the photo and pressure sensitive recording medium, onto the developing sheet. Further, an image recording apparatus has also been proposed by the same assignee as the present application, in which the developing sheet immediately after having been pressurized and developed is caused to pass through a nip between a pair of heat-treatment rollers or heat-fixing rollers, in order to improve the color characteristic and the gloss of the developed image on the developing sheet.

It is often desired that the image sheet obtained by the image recording apparatus is stuck on a postcard, or that the image sheet is inserted into a pair of transparent plastic films to stick the image sheet and the plastic films together, like a telephone card. In such case, however, a sticking or laminating device as shown in FIG. 1 has been required independently of the body of the image recording apparatus. Specifically, the sticking device comprises a pair of heat-treatment rollers 9 and 10, and a heater 8 for heating a lower one of the heat-treatment rollers 9. A transparent film 5 and an image sheet 6 serving as a sheet-like carrier are superposed one upon the other through hot-melt adhesive material 7. The transparent film 5 and the image sheet 6 superposed one upon the other are caused to pass through the nip between the heat-treatment rollers 9 and 10, so that the film 5 and the image sheet 6 are stuck together with the adhesive material 7.

In the image recording apparatus, moreover, from the nature of the function of the heat-fixing rollers, that is the heat-fixing of the image onto the developing sheet, the heat-fixing rollers are arranged adjacent the terminating end of the transport path along which the developing sheet is transported. That is, the heat-fixing rollers are located adjacent an inner surface of the side wall of a casing of the image recording apparatus. Usually, a platen for an original and other component parts are arranged at the top wall of the casing. Because of such arrangement, it is troublesome to position and assemble various component parts within the casing, resulting in an increase in the manufacturing cost. Further, it is difficult to restrain a rise in temperature due to the heat-fixing rollers in use of the image recording apparatus for a long period of time.

SUMMARY OF THE INVENTION

It is therefore an object of this invention to provide an improved image recording apparatus comprising a pair of heat-treatment rollers capable of being utilized also for another purposes of use.

It is another object of the invention to provide an image recording apparatus capable of facilitating positioning and assembling of component parts thereby restraining an increase in the manufacturing cost.

It is still another object of the invention to provide an image recording apparatus capable of adequately adjusting nip pressure between a pair of heat-treatment rollers in accordance with the purposes of use of the heat-treatment rollers.

It is another object of the invention to provide an image recording apparatus capable of insulating radiation of heat from a pair of heat-treatment rollers to other component parts which are required to avoid the influence of heat.

For the above purpose, according to the invention, there is provided an image recording apparatus utilizing a developing sheet, which comprises:

a casing provided in its wall with an external insertion opening;

a pair of heat-treatment rollers arranged within the casing, the pair of heat-treatment rollers defining therebetween a nip;

means for defining a first predetermined transport paths which extends through the nip between the pair of heat-treatment rollers, wherein the developing sheet having carried thereon an image is transported along the first predetermined transport path, is caused to pass through the nip between the pair of heat-treatment rollers, and is heat-treated thereby so that the image on the developing sheet is fixed and recorded onto the developing sheet;

means for defining a second predetermined transport path extending through the nip between the pair of heat-treatment rollers, the second predetermined transport path being different from the first predetermined transport path and extending from the external insertion opening, wherein an article inserted through the external insertion opening can travel along the second predetermined transport path so that the article is caused to pass through the nip between the pair of heat-treatment rollers and is heat-treated thereby.

Preferably, the pair of heat-treatment rollers are arranged at an upper location within the casing, and the wall provided therein with the external insertion opening is a top wall of the casing.

Further, according to the invention, there is provided an image recording apparatus which comprises:

a casing;

a pair of heat-treatment rollers arranged within the casing, the pair of heat-treatment rollers defining therebetween a nip;

means for heating at least one of the pair of heat-treatment rollers;

pressure-adjusting means for adjusting nip pressure between the pair of heat-treatment rollers;

means for defining at least first and second predetermined transport paths which extend within the casing and which are different from each other, the first and second predetermined transport paths extending through the nip between the pair of heat-treatment rollers; and path-selecting means for permitting an article to travel along only a selected one of the first and second predetermined transport paths in accordance with a level of the nip pressure between the pair of heat-treatment rollers adjusted by the pressure-adjusting means, and for prohibiting an article from traveling along the remaining at least one predetermined transport path.

Moreover, according to the invention, there is provided an image recording apparatus wherein a latent image on a recording medium is developed onto a developing sheet to record an image corresponding to the latent image, onto the developing sheet, which comprises:

a pair of pressurizing and developing rollers defining therebetween a nip through which a predetermined transport path extends, the developing sheet being transported along the predetermined transport path, wherein the recording medium having carried thereon the latent image and the developing sheet are caused to pass through the nip between the pair of pressurizing and developing rollers, with the recording medium and the developing sheet superposed one upon the other, and the pair of pressurizing and developing rollers cooperate with each other to apply pressure to the recording medium and the developing sheet caused to pass through the nip between the pressurizing and developing rollers, to develop the latent image on the recording medium, onto the developing sheet;

a pair of heat-fixing rollers defining therebetween a nip through which the predetermined transport path extends, wherein the developing sheet having carried thereon the developed image is caused to pass through the nip between the pair of heat-fixing rollers, and the pair of heat-fixing rollers cooperate with each other fix the image on the developing sheet; and heat-insulating means arranged between the pair of pressurizing and developing rollers and the pair of heat-fixing rollers, for insulating radiation of heat from the pair of heat-fixing rollers to the pair of pressurizing and developing rollers, wherein the heat-insulating means has an opening, and the predetermined transport path extending from the nip between the pair of pressurizing and developing rollers toward the nip between the pair of heat-fixing rollers extends through the opening.

BRIEF DESCRIPTION OF THE ACCOMPANYING DRAWINGS

DESCRIPTION OF THE EMBODIMENTS

The invention will be described below in detail with reference to FIGS. 2 through 16 of the accompanying drawings. An image recording apparatus embodying the invention and various modifications thereof are shown as utilizing a photo and pressure sensitive recording web and developing sheets suitable for color printing, as proposed in U.S. Pat. No. 4,399,209. It is to be understood, however, that if different types of recording medium and developing sheets are used, an exposure system can be employed as it is, though a slight modification is required for a heat-fixing system.

Figure 2:
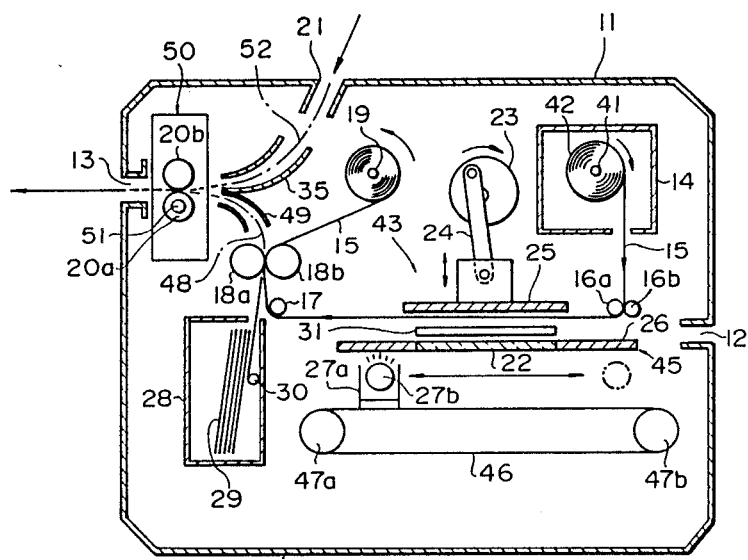
FIG. 2 is a schematic structural view of an image recording apparatus embodying the invention.

Referring first to FIG. 2, there is illustrated the image recording apparatus embodying the invention. The image recording apparatus comprises a casing 11 which is provided with an original insertion opening 12 in a right-hand end wall and a discharge opening 13 in a left-hand end wall for a developing sheet 29 having carried thereon a developed and fixed image. A roll cassette 14 is detachably mounted within the casing 11 at an upper location adjacent the right-hand end wall of the casing 11. A continuous photo and pressure sensitive recording web 15, which may be responsive to light of predetermined wavelengths, is wound around a core 41 into a roll 42 which is accommodated in the roll cassette 14. A pair of guide and drive rollers 16a and 16b are arranged below the roll cassette 14 for drawing the recording web 15 out of the roll cassette 14. The recording web 15 unwound from the roll 42 and drawn out of the roll cassette 14 is transported along a predetermined traveling path. Specifically, the recording web 15 is first guided horizontally by the guide and drive rollers 16a and 16b and a guide and feed roller 17 between which an exposure station 43 is arranged. Subsequently, the recording web 15 is caused to pass through a nip between a pair of pressurizing and developing rollers 18a and 18b, and then is wound around a take-up roller 19.

The exposure station 43 is arranged upstream of the nip between the pair of pressurizing and developing rollers 18a and 18b with reference to a traveling direction of the photo and pressure sensitive recording web 15 along the predetermined traveling path. The exposure station 43 includes a platen 45 which is arranged horizontally. The platen 45 is composed of a rectangular frame 26 and a transparent glass plate 22 fitted in the frame 26. A light-transmissive original 31 having image information is adapted to be inserted through the original insertion opening 12 so that the original 31 can be set in position on the platen 45. A light source unit 27a having incorporated therein a daylight fluorescent lamp 27b is fixedly mounted on an endless wire cable 46 passing around a pair of pulleys 47a and 47b. One of the pulleys 47a and 47b is drivingly connected to a drive motor, not shown, to reciprocatively move the light source unit 27a in parallel relation to the platen 45. When turned on, the fluorescent lamp 27b exposes the original 31 on the platen 45 to form a latent image corresponding to the image information on the original 31, onto a longitudinal portion of the recording web 15.

A contact plate 25 is arranged above the platen 45 and is movable between an operative position where the contact plate 25 stationarily urges the original 31 as well as the longitudinal portion of the recording web 15 against the platen 45, and an inoperative position shown in FIG. 2 where the contact plate 25 is spaced upwardly from the platen 45. A drive mechanism for moving the contact plate 25 between the operative and inoperative positions comprises a connecting rod 24 having one end thereof pivotally connected to the contact plate 25. The other end of the connecting rod 24 is pivotally connected to an end face of a rotatable disc member 23 driven by the drive motor, not shown. It will be seen that rotation of the disc member 23 causes the contact plate 25 to be moved between the aforesaid operative and inoperative positions.

A sheet feed cassette 28 is detachably mounted within the casing 11 of the image recording apparatus, and is arranged below the pair of pressurizing and developing rollers 18a and 18b. In the sheet feed cassette 28, a stack of a plurality of developing cut sheets 29 is accommodated in a vertically inclined manner. The developing sheets 29 within the sheet feed cassette 28 are fed one by one by a sheet feed roller 30 along a predetermined transport path 48 extending through the nip between the pair of presssurizing and developing rollers 18a and 18b. A guide member 49 defining a part of the predetermined transport path 47 guides the developing sheet 29 toward a nip between a pair of heat-treatment or heat-fixing rollers 20a and 20b of a heat-fixing unit 50 which is arranged above the sheet feed cassette 28. A lower one of the pair of heat-fixing rollers 20a has incorporated therein a heater 51 for heating the lower roller 20a, while the other upper roller 20b is formed by a rubber roller.

An external insertion opening 21 is formed in a top wall of the casing 11. A guide member 35 defines a predetermined transport path 52 which extends from the external insertion opening 21 and through the nip between the heat-fixing rollers 20a and 20b. The predetermined transport paths 48 and 52 from the nip between the heat-fixing rollers 20a and 20b extend to the discharge opening 13.

Figure 1:
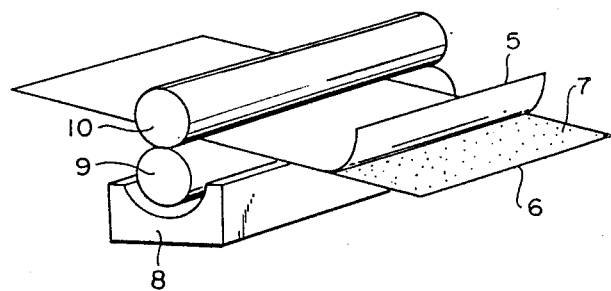
FIG. 1 is a perspective view of a conventional sticking or laminating arrangement independent of an image recording apparatus.
Figure 3:
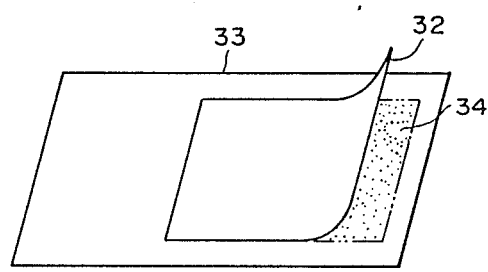
FIG. 3 is a perspective view of an article comprised of a postcard and an image sheet which can be stuck together with adhesive material by the use of a pair of heat-treatment rollers illustrated in FIG. 2.

Any suitable articles requiring heat treatment by the heat-fixing rollers 20a and 20b can be inserted through the external insertion opening 21. For example, the article may be one composed of a transparent film and an image sheet to be stick together with hot-melt adhesive material, as shown in FIG. 1. Alternatively, as shown in FIG. 3, the article may be composed of a postcard 33 serving as a sheet-like carrier, an image sheet 32 and sheet-like hot-melt adhesive material 34 arranged between the postcard 33 and the image sheet 32. It is needless to say that the image sheet 32 may be the developing sheet 29 having carried thereon a developed and fixed image, which is obtained by the illustrated image recording apparatus.

The operation of the image recording apparatus constructed as above will next be described below.

The original 31 is inserted through the original insertion opening 12 and is set in position on the glass plate 22 of the platen 45. The photo and pressure sensitive recording web 15 is unwound from the roll 42 by cooperation of the guide and drive rollers 16a and 16b, and a longitudinal fresh portion of the recording web 15 is brought to the exposure station 43. The disc member 23 is driven by the drive motor so that the contact plate 25 is moved downwardly to the operative position to urge the longitudinal portion of the recording web 15 and the original 31 against the platen 45. The original 31 is maintained in pressure contact with the glass plate 22 of the platen 45. The exposure fluorescent lamp 27b is turned on, and the pulleys 47a and 47b are rotated to move the light source unit 27a from the position adjacent the pulley 47a toward the position adjacent the pulley 47b. The exposure fluorescent lamp 27b carries out line-exposure with respect to the original 31 to form a latent image corresponding to the image information on the original 31, onto the longitudinal portion of the photo and pressure sensitive recording web 15. The exposure fluorescent lamp 27b is then turned off, and the light source unit 27a is returned to its initial position.

After exposure, the contact plate 25 is moved upwardly to the inoperative position to release the original 31 and the recording web 15 from pressure-contact with the platen 45. The recording web 15 is transported along the predetermined traveling path under the action of the guide and feed roller 17 and the take-up roller 19 so that the longitudinal portion of the web 15 having formed thereon the latent image travels toward the nip between the pair of pressurizing and developing rollers 18a and 18b. In synchronism with traveling of the longitudinal portion of the web 15 toward the nip between the rollers 18a and 18b, the developing sheet 29 is fed along the predetermined transport path by the sheet feed roller 30. The longitudinal portion of the recording web 15 and the developing sheet 29 are then caused to pass through the nip between the pressurizing and developing rollers 18a and 18b, with the longitudinal portion of the web 15 and the developing sheet 29 superposed one upon the other. The pair of pressurizing and developing rollers 18a and 18b cooperate with each other to apply pressure to the longitudinal portion of the recording web 15 and the developing sheet 29 to develop the latent image on the longitudinal portion of the recording web 15 onto the developing sheet 29. Thus, an image corresponding to the latent image on the longitudinal portion of the recording web 15 is developed onto the developing sheet 29.

After the development, the recording web 15 is wound around the take-up roller 19. On the other hand, the developing sheet 29 continues to travel along the predetermined transport path 48 toward the heat-fixing unit 50. The developing sheet 29 is caused to pass through the nip between the rubber roller 20a and the heat roller 20a heated to approximately 120 degrees C. by the heater 51. The heat-fixing rollers 20a and 20b cooperate with each other to fix the developed image on the developing sheet 29, so that it is possible for the image on the developing sheet 29 to obtain sufficient color development and gloss. Subsequently, the developing sheet 29 having carried thereon the fixed image is discharged out of the casing 11 through the discharge opening 13.

When it is desired to stick the thus obtained image sheet to a postcard or the like, as shown in FIG. 3, the image sheet 32 and the postcard 33 are superposed one upon the other through the sheet-like hot-melt adhesive material 34. The superposed image sheet 32 and postcard 33 are inserted through the external insertion opening 21. The superposed image sheet 32 and postcard 33 are transported along the predetermined transport path 52 and are caused to pass through the nip between the heat-fixing rollers 20a and 20b. By doing so, the hot-melt adhesive material 34 is molten under heat from the heat roller 20a, to stick the image sheet 32 and the postcard 33 together with the adhesive material 34. The stuck image sheet 32 and postcard 33 are discharged out of the casing 11 through the discharge opening 13.

In the embodiment illustrated in FIG. 2, it is to be understood that a photo-sensitive recording medium necessitating fixture due to heat may effectively used in substitution for the photo and pressure sensitive recording web and the color-developing sheet. Moreover, the light source and the developing mechanism may be assembled into a single unit independent of the heat-fixing unit. Alternatively, the light source, the developing mechanism and the heat-fixing rollers may all be assembled into a single unit. Further, the casing of the apparatus may be provided with heat-radiating plates and/or ventilation windows.

As described above, the arrangement of the embodiment illustrated in FIG. 2 is such that the same heat-fixing unit is employed to heat-treat not only the developing sheets 29, but also the articles inserted through the external insertion opening 21. For example, it is possible that the developing sheet 29 having carried thereon the developed and fixed image, obtained by the image recording apparatus, is stuck to a postcard or the like by the use of the same apparatus. Thus, the image recording apparatus does not need a separate or independent sticking or laminating device, making it possible to prevent the cost from increasing.

Moreover, the arrangement of the embodiment shown in FIG. 2 is such that the pair of heat-treatment or heat-fixing rolls 20a and 20b are arranged at the upper location within the casing 11, and the external insertion opening 21 is formed in the top wall of the casing 11. Accordingly, the transport path 52 extending between the external insertion opening 21 and the heat-fixing rollers 20a and 20b can be shortened, making it possible to facilitate positioning and assembling of various component parts within the casing 11. Thus, an increase in the manufacturing cost can correspondingly be restrained. It is also possible to expedite heat radiation from the heat-fixing rollers 20a and 20b.

Figure 4:
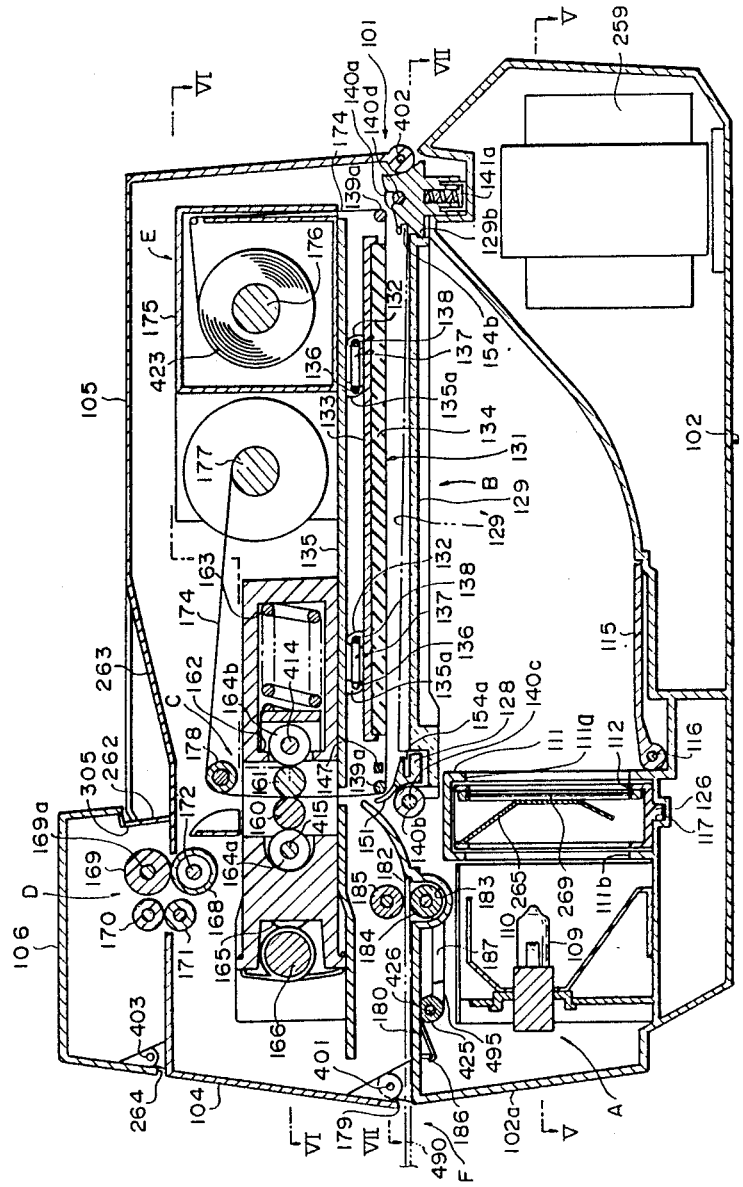
FIG. 4 is a longitudinal cross-sectional view of an image recording apparatus according to a modification of the invention.
Figure 5:
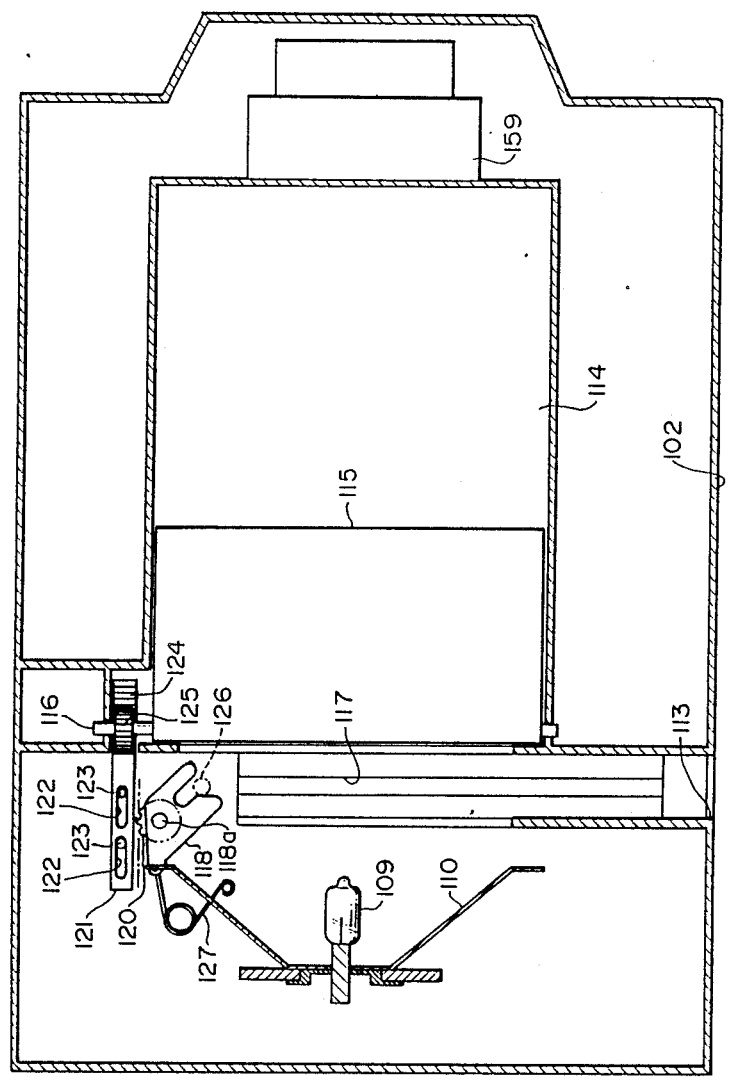
FIG. 5 is a cross-sectional view taken along line V—V in FIG. 4, showing a shutter plate and an operating mechanism therefor.
Figure 6:
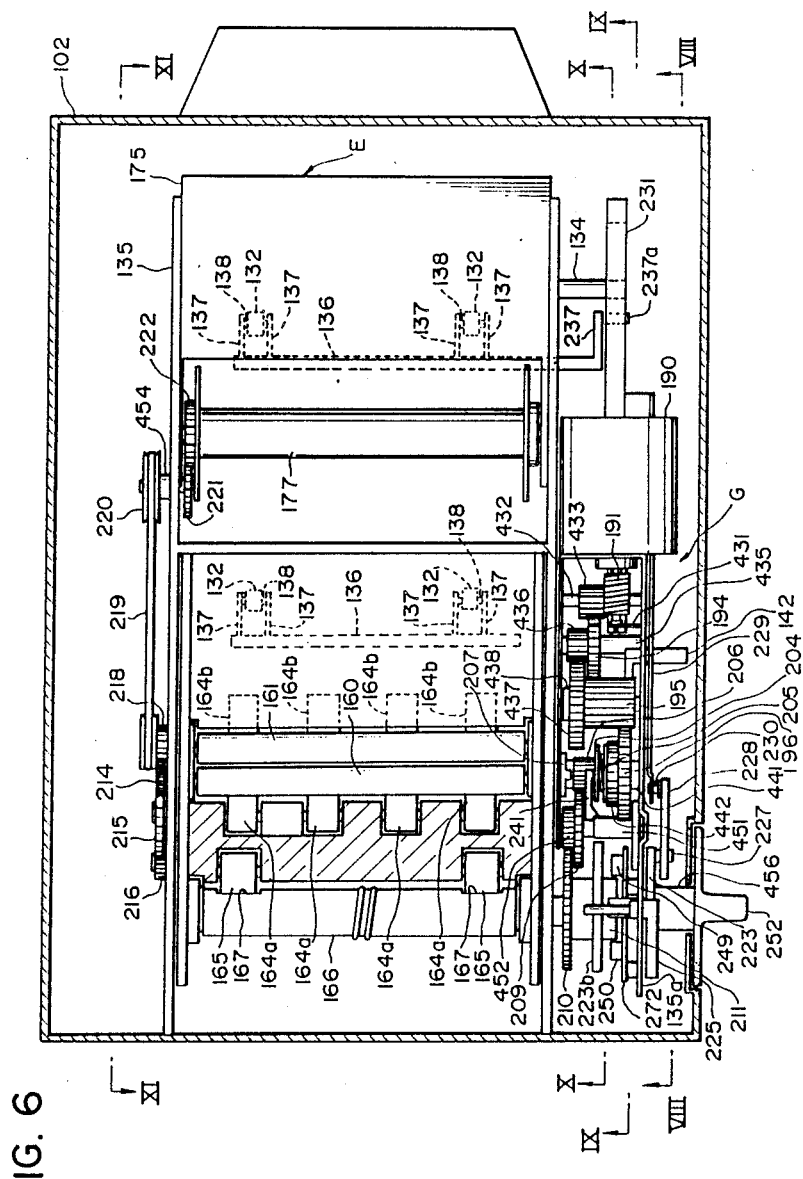
FIG. 6 is a cross-sectional view taken along line VI—VI in FIG. 4, showing a drive mechanism for various rotatable and pivoting component parts.

Referring to FIGS. 4 through 15, there is shown a modification of the image recording apparatus, which generally comprises, as illustrated in FIG. 4, an exposure light source section A, an exposure station B, a pressurizing and developing station C, a heat-fixing station D, a cartridge section E for accommodating a photo and pressure sensitive recording web, a developing-sheet insertion section F and a drive section G (see FIG. 6).

A casing 101 of the apparatus comprises a lower casing section 102. A front cover 104 is mounted to the lower casing section 102 for pivotal movement together with a frame 135 subsequently to be described, relative to the lower casing section 102 about a pivot 401. A rear cover 105 is also mounted to the lower casing section 102 for pivotal movement relative thereto about a pivot 402. An upper cover 106 is mounted to the front cover 104 for pivotal movement relative thereto about a pivot 403.

The exposure light source section A comprises a halogen lamp 109 serving as a light source for exposure. The halogen lamp 109 is located within the lower casing section 102 adjacent a front wall 102a thereof. The halogen lamp 109 is arranged horizontally and is surrounded by a reflector 110. A filter box 111 formed with a pair of front and rear openings 111a and 111b is arranged in front of the halogen lamp 109. A light-diffusion plate 114 having a curved concave reflecting surface is arranged in front of the filter box 111. A filter case 112 is insertable into the filter box 111 through a filter insertion opening 113 (see FIG. 5) provided in a side wall of the lower casing section 102. A color filter 269 is accommodated in the filter case 112 and is held in position by a spring 265.

A shutter plate 115 is associated with the filter box 111, and is mounted to the lower casing section 102 for pivotal movement relative thereto about a pivot shaft 116 between open and closed positions. In the open position illustrated in FIG. 4, the shutter plate 115 opens the front opening 111a in the filter box 111, and an upper surface of the shutter plate 115 is substantially contiguous to the light-reflecting surface of the light-diffusion plate 114. In the closed position, the shutter plate 115 closes the front opening 111a in the filter box 111.

A mechanism for moving the shutter plate 115 between the open and closed positions will be described with reference to FIGS. 4 and 5. The filter box 111 is provided in its bottom wall with a rail groove 117. A shutter operating plate 118 is arranged adjacent an end of the rail groove 117 remote from the filter insertion opening 113. The shutter operating plate 118 is mounted on a pivot 118a for pivotal movement thereabout. A gear wheel 120 is fixedly mounted to the shutter operating plate 118 for angular movement therewith about the pivot 118a. A rack 121 has rack teeth in mesh with teeth on the gear wheel 120. The rack 121 is formed therein with a pair of slots 122 and 122. A pair of pins 123 and 123 fixedly mounted to the lower casing section 102 are slidably fitted respectively in the slots 122 and 122. Thus, the rack 121 is reciprocatively movable horizontally in a direction perpendicular to the axis of the pivot shaft 116, while being guided by the pins 123 The rack 121 has an end portion adjacent the pivot shaft 116, which is formed with teeth 124 in mesh with teeth of a gear wheel 125 fixedly mounted on the pivot shaft 116. A spring 127 serving as a click for the shutter plate 115 is interposed between the lower casing section 102 and the shutter operating plate 118. The arrangement is such that when the filter case 112 is not set in the filter box 111, the shutter plate 115 occupies its closed position where the front opening 111a (see FIG. 4) in the filter box 111 is closed. On the other hand, as the filter case 112 is inserted into the filter box 111, an engaging pin 126 provided on the bottom of the filter case 112 is brought into engagement with the shutter operating plate 118, to move the shutter plate 115 from the closed position to the open position as indicated by an arrow a in FIG. 4.

Figure 12:
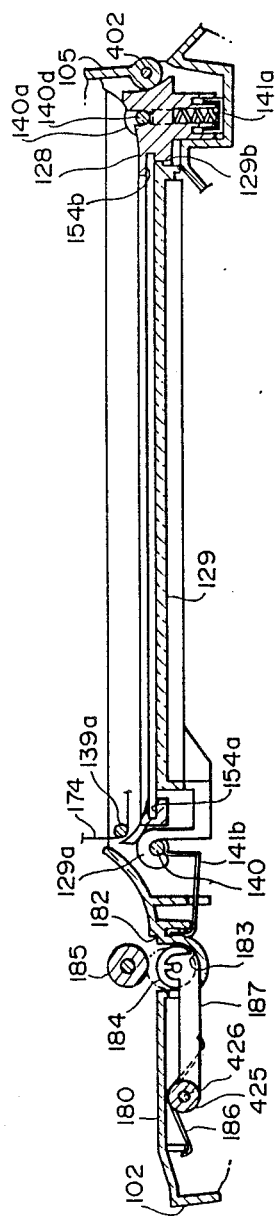
FIG. 12 is a fragmental cross-sectional view taken along line XII—XII in FIG. 7, showing the pair of developing-sheet feed rollers a lower one of which is movable toward and away from the other upper feed roller between the solid-line position and the phantom-line position.

The exposure station B will be described with reference mainly to FIGS. 4, 7 and 12. A rectangular frame 128 is fixedly mounted to the lower casing section 102. A transparent platen 129 for an original is received in the rectangular frame 128. The platen 129 has one end resting on a pair of laterally spaced ledge portions 129b and 129b on the rectangular frame 128. A pair of laterally spaced hooks 129a and 129a are provided on the other end of the platen 129, and are in engagement with a shaft 140c on which a pair of laterally spaced load rollers 140a and 140b are mounted. Thus, as the shaft 140c for the load rollers 140a and 140a is moved substantially vertically, the platen 129 is angularly moved about the ledge sections 129b and 129b between the position indicated by the solid line in FIG. 4 and the position indicated by the phantom line in FIG. 4.

A contact-plate assembly 131 is arranged above the platen 129 in spaced relation thereto. The contact-plate assembly 131 is composed of a base plate 133 and a rubber contact plate 134 stuck to a lower surface of the base plate 133. The contact-plate assembly 131 is hung from the frame 135 for movement relative thereto between operative and inoperative positions. Specifically, referring also to FIG. 6, a pair of longitudinally spaced shafts 136 and 136 are rotatably supported by brackets 135a and 135a fixedly mounted to the lower surface of the frame 135. Each of the shafts 136 has fixedly mounted thereto two pairs of pivoting rods 137 in spaced relation along the shaft 136. The free ends of the respective pivoting rods 137 in each pair are connected to each other through a pin 138. Hooks 132 are fixedly mounted to the upper surface of the base plate 133, and are in engagement respectively with the pins 138. Thus, the contact-plate assembly 131 is hung from the frame 135.

Figure 7:
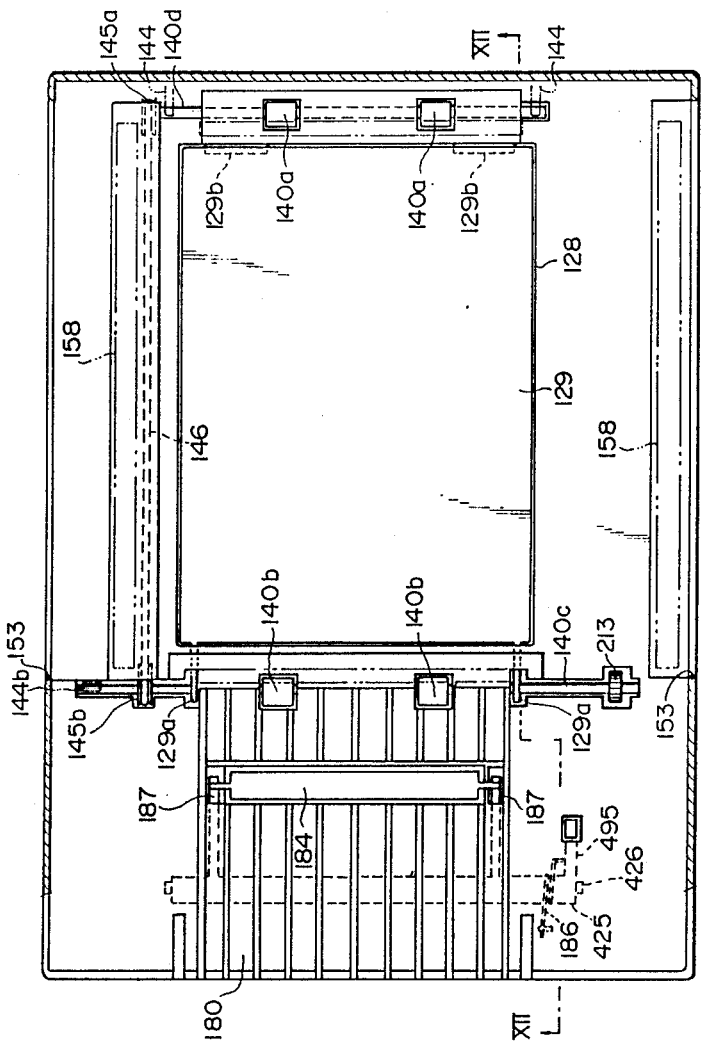
FIG. 7 is a cross-sectional view taken along line VII—VII in FIG. 4, showing a guide plate for a developing sheet and a lower one of a pair of developing-sheet feed rollers.
Figure 15:
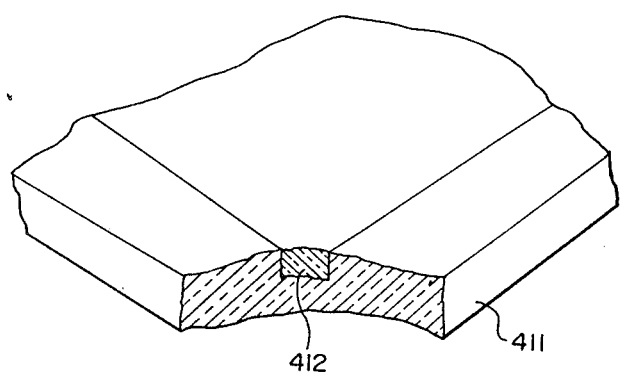
FIG. 15 is a fragmental enlarged perspective view of a transparent frame and an original set on and in the frame, employed in the image recording apparatus illustrated in FIG. 4.

A rectangular light-transmissive original frame 411 having set thereon a transparent original 412, as shown in FIG. 15, is adapted to be inserted through one of a pair of original-insertion openings 153 and 153 formed respectively in the opposite side walls of the lower casing section 102 as clearly shown in FIG. 7. To this end, as shown in FIG. 4, the rectangular frame 128 has a pair of guide grooves 154a and 154b formed respectively in the opposite ends of the frame 128.

A continuous photo and pressure sensitive recording web 174 is transported along a predetermined traveling path which extends through a space between the contact-plate assembly 131 and the platen 129. The recording web 174 is guided by a pair of guide rollers 139a and 139b between which the exposure station B is arranged. As described previously with reference to FIG. 7, the pair of load rollers 140b and 140b are fixedly mounted on the shaft 140c. A shaft 140d is rotatably supported on the rectangular frame 128 at a location adjacent the guide roller 139a. A pair of laterally spaced load rollers 140a and 140a are fixedly mounted to the shaft 140d. The load rollers 140a and 140b are arranged to be movable respectively toward and away from the guide rollers 139a and 139b. A pair of pulleys 145a and 145b are fixedly mounted respectively on the shafts 140d and 140c. A belt 146 passes around the pulleys 145a and 145b. The load rollers 140a and 140b are biased respectively toward the guide rollers 139a and 139b under the action of respective load roller springs 141a and 141b. Normally, however, the opposite ends of the shaft 140d are pushed back against the springs 141a by a pair of pawl members 144 fixedly mounted to the end wall of the rear cover 105, so that the load rollers 140a are spaced away from the guide roller 139a. Likewise, one end of the shaft 140c is pushed back by a pawl member 144b fixedly mounted to the top wall of the rear cover 105, and the other end of the shaft 140c is pushed back under the biasing force of a spring 143 (see FIGS. 8 and 9) associated with a sheet feed lever 142, so that the load rollers 140b are spaced away from the guide roller 139b. When the rear cover 105 is pivotally moved about the pivot 402 to an open position in order to thread the recording web 174 into the predetermined traveling path, the pawl members 144 and the pawl member 144b fixedly mounted to the rear cover 105 are disengaged respectively from the shafts 140d and 140c, so that the load rollers 140a and 140b are brought into engagement respectively with the guide rollers 139a and 139b under the action of the respective springs 141a and 141b. Moreover, a load gear 213 is fixedly mounted on the shaft 140c for the load rollers 140b, and is operatively connected to a drive mechanism subsequently to be described.

As shown in FIG. 4, an exposure slit tube 147 for re-exposure of the photo and pressure sensitive recording web 174 is arranged adjacent the guide roller 139b on the exit side of the exposure station B. The exposure slit tube 147 serves to expose the recording web 174 over the entire surface thereof, in order to eliminate variation in exposure amount. A sheet guide plate 151 located on the exit side of the exposure station B is formed into an arcuate configuration so that when the photo and pressure sensitive recording web 174 in the form of a roll 423 is installed within the casing 101 of the apparatus, a leader sheet section connected to the leading edge of the recording web 174 is automatically guided toward the pressurizing and developing station C subsequently to be described. Moreover, as shown in FIG. 7, a pair of light-shielding rollers 158 and 158 are associated respectively with the original insertion openings 153 and 153 for preventing penetration of light into the casing 101 from the outside.

The pressurizing and developing station C will next be described with reference mainly to FIGS. 4 and 6. The pressurizing and developing station C comprises a pair of pressurizing and developing rollers 160 and 161 which are mounted for movement toward and away from each other. One of the pressurizing and developing rollers 161 is backed up by a plurality of backup rollers 164b which are mounted on a shaft 414 in spaced relation to each other along the shaft 414. The backup rollers 164b are urged against a stopper 162 under the action of a coil spring 163. The other pressurizing and developing roller 160 is urged toward the one pressurizing and developing roller 161 by a cam roller 166 through a pair of rollers 165 and 165 and a plurality of backup rollers 164a which are mounted on a shaft 415 in spaced relation to each other along the shaft 415. A pair of cam grooves 167 and 167 are formed in the periphery of the cam roller 166 respectively adjacent the opposite ends thereof. The pair of rollers 165 and 165 are engageable respectively with the pair of cam grooves 167 and 167. The arrangement is such that when the rollers 165 and 165 are out of engagement respectively with the cam grooves 167 and 167 during rotation of the cam roller 166, the pressurizing and developing roller 160 is urged against the pressurizing and developing roller 161, while when the rollers 165 and 165 are fitted into engagement respectively with the cam grooves 167 and 167, pressure contact of the pressurizing and developing roller 160 with the pressurizing and developing roller 161 is released. A longitudinal portion of the photo and pressure sensitive recording web 174, which has a length corresponding to one image, is fed by one revolution of the cam roller 166. A driving mechanism for the pressurizing and developing station C will be described later.

The heat-fixing station D will next be described with reference chiefly to FIGS. 4 and 13. The heat-fixing station D comprises a pair of heat-fixing rollers 168 and 169 and a pair of feed-out rollers 170 and 171 which are arranged on the left-hand side of the heat-fixing rollers 168 and 169 as viewed in FIG. 4. One of the pair of heat-fixing rollers 168 has incorporated therein a heater 172 for heating the roller 168. A thermistor (not shown) is applied to the peripheral surface of the roller 168. The heater 172 is controlled in temperature in response to a signal from the thermistor. A shaft for the feed-out roller 171 and a shaft for the heat-fixing roller 168 extend between the opposite side walls of the frame 135 and are rotatably supported thereby. On the other hand, a shaft for the feed-out roller 170 extends between the opposite side walls of a sub-frame 135b (see FIGS. 8 through 11) mounted to the upper cover 106 and is rotatably supported by the side walls of the sub-frame 135b. Further, a shaft 169a for the heat-fixing roller 169 extends between a pair of support plates 300 and 300 and are rotatably supported thereby. The support plates 300 and 300 are pivotally mounted respectively to the opposite side walls of the sub-frame 135a by means of respective pivot pins 300a and 300a. Normally, the heat-fixing roller 169 is urged against the heat-fixing roller 168 under the action of the first spring 301 with nip pressure suitable for heat-fixing treatment of developing sheets 490 (see FIG. 4) subsequently to be described. Likewise, a pair of spring retainers 302 and 302 each in the form of an L-shaped plate are pivotally mounted respectively on the pivot pins 300a and 300a for pivotal movement thereabout relative to the respective support plates 300 and 300. Each of the support plates 300 is provided with a bent section 300b serving as a spring retaining section, and each of the spring retainers 302 is provided with a bent section 302a serving as a spring retaining section. A second coil spring 202 is interposed under compression between the bent section 300b of each of the attaching plates 300 and the bent section 302a of a corresponding one of the spring retainers 302, for applying nip pressure suitable for laminating treatment to the nip between the heat-fixing rollers 168 and 169. The second coil springs 202 are higher in biasing force than the spring 301. Each of the spring retainers 302 is provided at its upper side edge with a bent engaging projection 302b.

A pair of cams 304 (only one seen in FIG. 13) are fixedly mounted respectively to opposite ends of a shaft 421. A switching lever 203 subsequently to be described is also fixedly mounted to the shaft 421 for pivotal movement between first and second positions about the axis of the shaft 421, thereby pivotally moving the cams 304 about the axis of the shaft 421. The cams 304 and 304 have their respective upper ends which are engageable respectively with the engaging projections 302b and 302b of the respective spring retainers 302 and 302. Thus, when the switching lever 203 is in the first position shown in FIG. 13 where the upper ends of the respective cams 304 and 304 are maintained out of engagement with the respective engaging projections 302b and 302b, the nip pressure at a relatively low first level is applied to the nip between the pair of heat-fixing rollers 168 and 169, under the action of only the first spring 201. On the other hand, when the switching lever 203 is pivotally moved from the first position to the second position where the upper ends of the respective cams 304 are brought into engagement with the engaging projections 302b of the respective spring retainers 302, the spring retainers 302 are pivotally moved about the respective pivot pins 300a in the clockwise direction as viewed in FIG. 13, to compress the respective coil springs 302a. Thus, nip pressure at a second level which is the sum of the biasing force of the first spring 301 and the biasing force of the second springs 202, is applied to the nip between the heat-fixing rollers 168 and 169.

Each of the support plates 300 is provided with a projection 300c, and each of the spring retainers 302 is provided with a projection 302c. When the switching lever 203 is in the first position shown in FIG. 13, the projections 300c of the respective support plates 300 and the projections 302c of the respective spring retainers 302 are maintained in engagement with each other under the action of the coil springs 302a so that biasing forces of the respective coil springs 302a are not influenced upon the nip pressure between the pair of heat-fixing rollers 168 and 169.

The cartridge section E for accommodating the photo and pressure sensitive recording web 174 will next be described with reference mainly to FIG. 4. A recording web cassette 175 is detachably mounted at the cartridge section E. An uncoiler 176 and a recoiler 177 are arranged within the recording web cassette 175. The photo and pressure sensitive recording web 174 is wound around the uncoiler 176 into the roll 423. Although a drive mechanism for the recoiler 177 will be described later, the traveling path along which the recording web 174 is transported will be explained here briefly. The recording web 174 unwound from the roll 423 and drawn out of the recording web cassette 175 passes through a gap between the guide roller 139a and the load rollers 140a, and is guided to the space between the contact-plate assembly 131 and the platen 129. Subsequently, the recording web 174 passes through a gap between the guide roller 139b and the load rollers 140b, and then passes through the nip between the pair of pressurizing and developing rollers 160 and 161. The recording web 174 then passes around the feed roller 178, and is wound around the recoiler 177. The feed amount of the recording web 174 is regulated by the feed roller 178, but this will be described later.

The developing-sheet inserting section F will next be described with reference mainly to FIGS. 4, 7, 9 and 10. An external insertion opening 179 for the developing sheet 490 is formed in the front cover 104 at a location between the front cover 104 and the lower casing section 102. A sheet guide plate 180 is arranged within the casing 101 and at the external insertion opening 179. The sheet guide plate 180 defines a part of a predetermined transport path along which the developing sheet 490 is transported. The sheet guide plate 180 is provided with a step serving as a stopper 182 located on the predetermined transport path for the developing sheet 490.

The leading edge of the developing sheet is engageable with the stopper 182 so that the developing sheet is once stopped by the stopper 182. The sheet guide plate 180 has a forward end portion which is formed into a curved configuration toward the approaching side of the nip between the pair of pressurizing and developing rollers 160 and 161. The sheet guide plate 180 is formed with a recess 183 adjacent the stopper 182.

A pair of feed rollers 184 and 185 define therebetween a nip through which the predetermined transport path for the developing sheet 490 extends. A lower one of the feed rollers 184 is movable toward and away from the other upper feed roller 185 formed by a pinch roller, between operative and inoperative positions. In the operative position, a part of the lower feed roller 184 projects out of the recess 183 so that the lower feed roller 184 is urged against the upper feed roller 185 to clamp therebetween the developing sheet 490 to impart driving force to the same, thereby transporting the developing sheet 490 along the predetermined transport path. On the other hand, in the inoperative position illustrated in FIG. 4, the lower feed roller 184 is fully accommodated in the recess 183 and is spaced away from the upper feed roller 185 to thereby impart no driving force to the developing sheet 490. The lower feed roller 184 is rotatably supported by forward ends of a pair of respective support rods 187 and 187 which are fixedly mounted to a tubular shaft 425 which, in turn, is mounted on a pivot shaft 426 for pivotal movement thereabout. The tubular shaft 425 is biased by a spring 186 so that the lower feed roller 184 supported by the support rods 187 and 187 is biased toward the upper feed roller 185. Normally, however, an arm 495 fixedly mounted to the end of the tubular shaft 425 is urged downwardly against the spring 186 so that the lower feed roller 184 supported by the support rods 187 and 187 is in the inoperative position shown in FIG. 4. A drive mechanism for moving the lower feed roller 184 between the operative and inoperative positions will be explained later.

The driving section G will lastly be described with reference chiefly to FIG. 6 and 8 through 10. The driving section G has a function of driving the exposure light source section A, the exposure station B, the pressurizing and developing section C, the heat-fixing section D, the cartridge section E for the photo and pressure sensitive recording web 174, and the sheet inserting section F in an organic manner.

The drive section G comprises a drive motor 190 and a worm gear 191 fixedly mounted on an output shaft of the drive motor 190. The worm gear 191 has a forward end which is born by a thrust bearing member 431. The worm gear 191 is in mesh with a helical gear 193 rotatably mounted on a shaft 432 fixedly mounted to the opposite side walls of the frame 135a. A gear 433 is mounted on the shaft 432 in coaxial relation to the helical gear 193 for rotation together with the same. The gear 433 is in mesh with a gear 194 rotatably mounted on a shaft 435 fixedly secured to the opposite side walls of the frame 135a. A gear 436 is mounted on the shaft 435 in coaxial relation to the gear 194 for rotation together with. The gear 436 is in mesh with a gear 437 rotatably mounted on a shaft 438 fixedly mounted to the opposite side walls of the frame 135a. A gear 195 is mounted on the shaft 438 in coaxial relation to the gear 437 for rotation therewith. The gear 195 is in mesh with a gear 196 rotatably mounted on a shaft 441 having one end fixedly secured to the side wall of the frame 135a. The shaft 441 has the other free end. A gear 442 is mounted on the free end of the shaft 441 in coaxial relation to the gear 196 for rotation therewith. The gear 442 is in mesh with a gear 197 fixedly mounted on a shaft 446 on which a gear 447 is mounted in coaxial relation to the gear 197 for rotation therewith. The gear 447 is in mesh with a gear 199 which is fixedly secured to an end of the shaft for the heat-fixing roller 168. A gear is fixedly secured to an end of the shaft 169a for the heat-fixing roller 169, and is in mesh with a gear 201 secured to an end of the shaft for the feed-out roller 170 through an intermediate gear 200.

Figure 16:
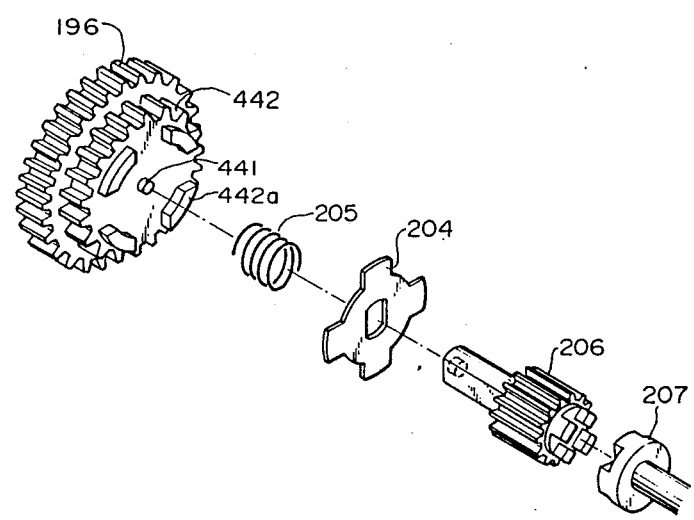
FIG. 16 is an enlarged, exploded perspective view of a clutch arrangement in the drive mechanism illustrated in FIG. 6.

As shown in FIGS. 6 and 16, the drive gear 196 is disengageably connected to the pressurizing and developing roller 160 through a clutch disc 204, a clutch spring 205, a coupler gear 206 and a coupler 207. Specifically, the coupler 207 is fixedly secured to the end face of the shaft for the pressurizing and developing roller 160. The coupler gear 206 is fitted into the coupler 207. The coupler gear 206 has a shaft portion projecting from an end face of the coupler gear 206. The clutch disc 204 is generally cruciform and is provided with a central opening. The shaft portion of the coupler gear 206 passes through the central opening in the clutch disc 204 in such a manner that the clutch disc 204 is slidable along the shaft portion, but is rotatable together therewith. The clutch disc 204 is engageable with an end face of a cut-out ring 442a integrally formed on the end face of the gear 442. The cut-out ring 442a is formed with four cut-outs circumferentially equidistantly spaced from each other. A coil spring 205 is interposed between the end face of the gear 442 and the clutch disc 204. The arrangement is such that as the clutch disc 204 is moved toward the gear 442 under the action of an operating lever 241 subsequently to be described, against the biasing force of the coil spring 205, and is brought into engagement with the cut-outs in the ring 442a, rotation of the gears 442 and 196 is transmitted to the pressurizing and developing roller 160.

Figure 8:
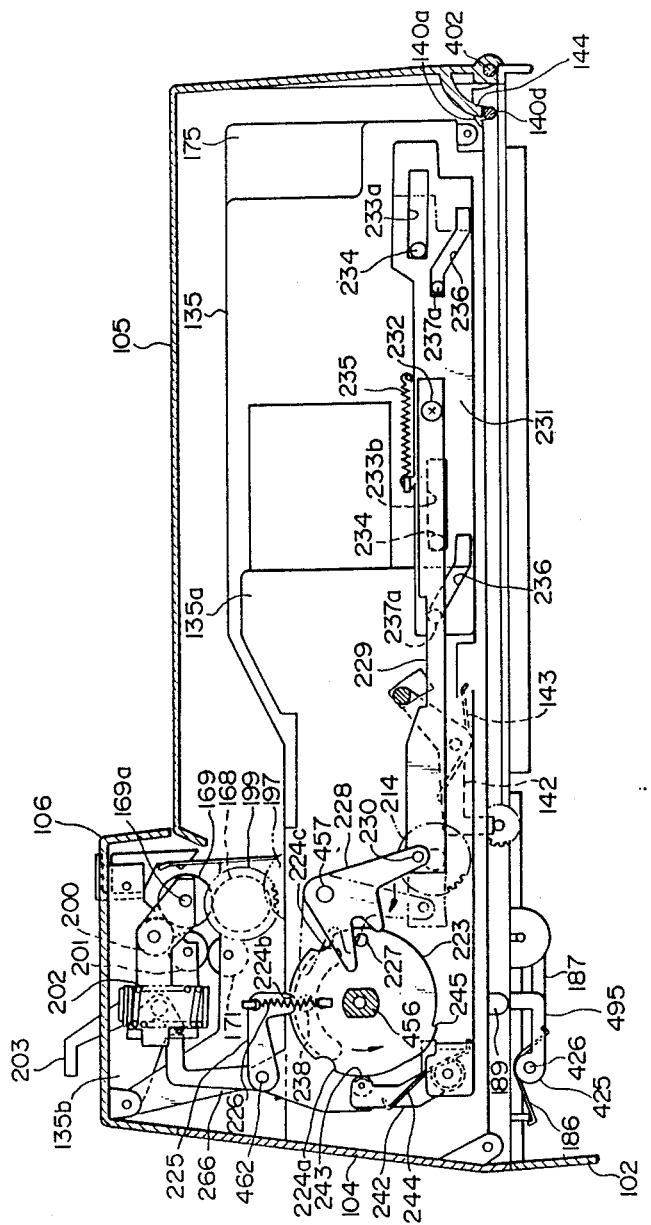
FIG. 8 is a fragmental cross-sectional view taken along line VIII—VIII in FIG. 6, showing a cam arrangement for controlling movement of a contact-plate assembly, and for controlling motion of other pivotal members.
Figure 9:
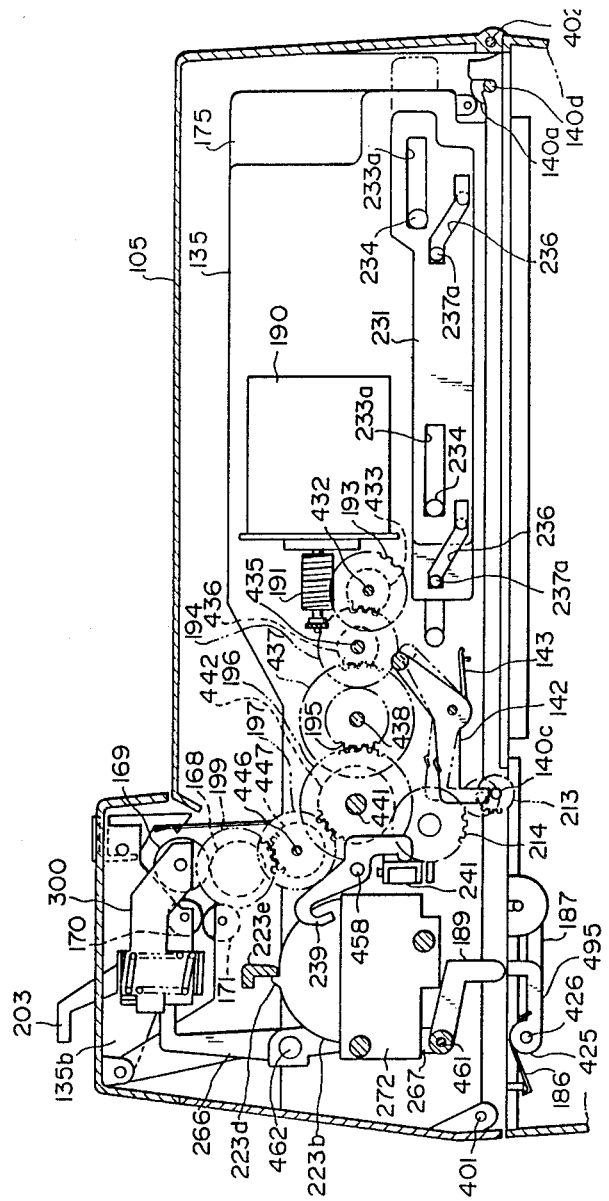
FIG. 9 is a fragmental cross-sectional view taken along line IX—IX in FIG. 6, showing a drive mechanism for a pair of heat-treatment or heat-fixing rollers.
Figure 11:
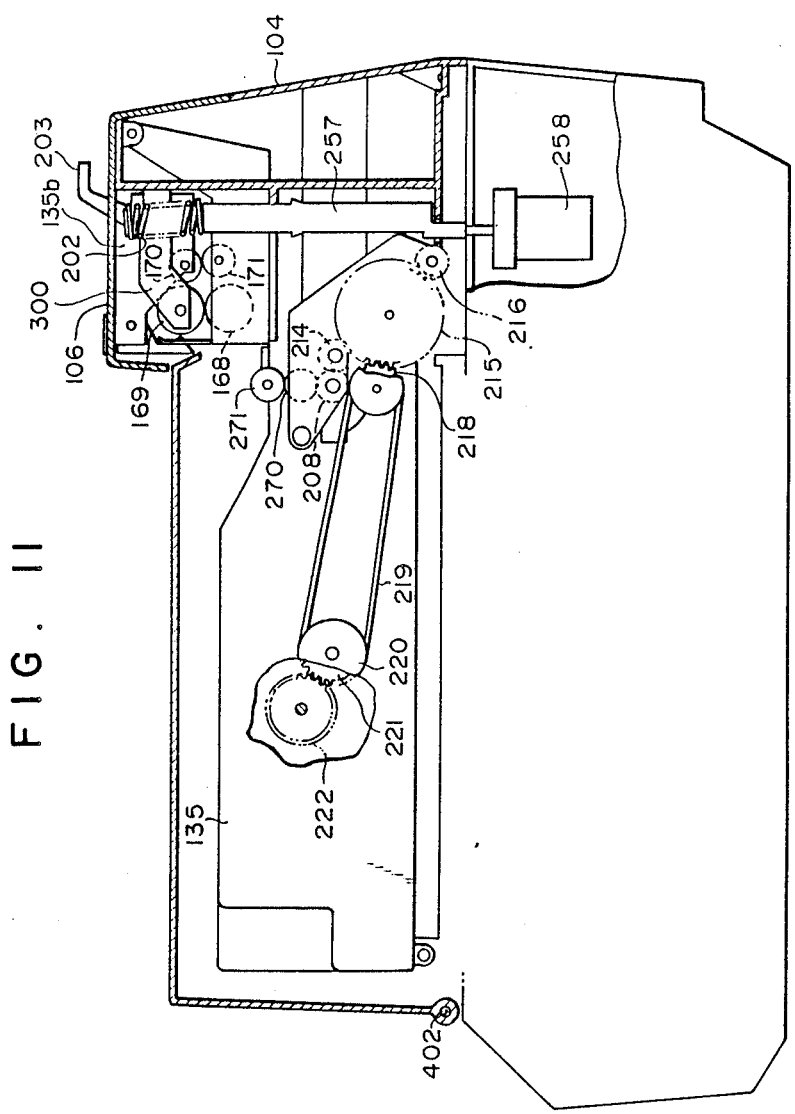
FIG. 11 is a cross-sectional view taken along line XI—XI in FIG. 6, showing a drive mechanism for rotating a recoiler around which a continuous photo and pressure sensitive recording web is taken up.

The coupler gear 206 is drivingly connected to a drive gear 208 (see FIG. 11) for the pressurizing and developing roller 161. The drive gear 208 is located on the side opposite to the drive motor 190. The coupler gear 206 is in mesh with an idle gear 209 rotatably mounted on a shaft 451 on which a gear 452 is mounted in coaxial relation to the gear 209 for rotation therewith. The gear 452 is in mesh with a cam gear 210 fixedly mounted on the shaft for the cam roller 266. As shown in FIG. 11, the drive gear 208 for the pressurizing and developing roller 161 is in mesh with a roll gear 271 for the recording-web feed gear 178 through an idle gear 170. Moreover, as shown in FIGS. 8 and 9, a load idle gear 214 is in mesh with the aforementioned gear 442. A load gear 213 is fixedly mounted on the shaft 140c for the load rollers 140b located on the leaving side of the exposure station B. The load gear 213 can be brought into meshing engagement with the load idle gear 214 by operation of the sheet-feed lever 142.

As shown in FIGS. 6 and 11, the driving force from the aforesaid drive gear 208 can be transmitted to the upper feed roller 185 (see FIG. 4) through a pulley gear 218, a supply idle gear 215 and a supply gear 216. Moreover, the driving force from the pulley gear 218 can be transmitted to a core pulley 220 through a belt 219. As clearly shown in FIG. 6, a core gear 221 is fixedly mounted on a shaft 454 on which the core pulley 220 is mounted for rotation together with the shaft 454. The core gear 221 is in mesh with a flange gear 222 fixedly secured to an end of a shaft for the recoiler 177. The pulley gear 218 and the core pulley 220 have their respective diameters which are set such that an amount by which the photo and pressure sensitive recording web 174 is wound about the recoiler 177 is more than that by which the recording web 174 is fed by the feed roller 178.

As shown in FIGS. 6 and 8, a cam plate 223 generally in the form of a disc is located in front of the outer side wall of the frame 135a remote from the cam roller 166 as will be seen in FIG. 6, and is mounted on a shaft 456 for rotation therewith. The shaft 456 is rotatably supported by the outer side wall of the frame 135a and the opposed side wall of the lower casing section 102. The cam plate 223 is formed in its periphery with three cut-outs 224a, 224b and 224c circumferentially spaced from each other. A lever stopper 225 selectively engageable with the cut-outs 224a, 224b and 224c is also mounted to the outer side wall of the frame 135a for pivotal movement relative thereto about a pivot 462. The lever stopper 225 is biased against the periphery of the cam plate 223 by a coil spring 226 interposed under tension between the cam plate 223 and the lever stopper 225, so that the lever stopper 225 is normally in engagement with the cut-out 224b. A boss 227 projects from an outer end face of the cam plate 223. An operating arm 228 is mounted to the outer side wall of the frame 135a for pivotal movement about a pivot 457, and has one end engageable with the boss 227. The other end of the operating arm 228 is pivotally connected to one end of an elongated operating plate 229 through a pin 230. The other end of the operating plate 229 is connected to an operating lever plate 231 by means of a screw 232.

The operating lever plate 231 is formed therein with a pair of slots 233a and 233b which extends horizontally and are spaced from each other. A pair of pins 234 and 234 fixedly mounted to the side wall of the frame 135 are slidably fitted respectively in the slots 233a and 233b so that the operating lever plate 231 is supported horizontally by the pins 234. A coil spring 235 is interposed between the side wall of the frame 135 and the operating lever plate 231 to pull the same rightwardly as viewed in FIG. 8. The operating lever plate 231 is formed therein with a pair of cam slots 236 and 236 each of which has a portion extending obliquely downwardly. On the other hand, as shown in FIG. 6, each of the pair of operating shafts 136 and 136, from which the contact-plate assembly 131 is hung, has one end projecting outwardly from the side wall of the frame 135. A pivotal lever 137 has one end fixedly connected to the projecting one end of each of the operating shafts 136. An engaging pin 237a is attached to the other end of the pivotal lever 137 and is slidably fitted in a corresponding one of the cam slots 236.

As shown in FIG. 8, a boss 238 is also provided which projects from the inner end face of the cam plate 223. The boss 238 is engageable with one end of a clutch lever 239 (see FIG. 9) which is pivotally mounted to an inner surface of the outer side wall of the frame 135a through a pivot 458. The other end of the clutch lever 239 is engageable with one end of the operating lever 241 (see FIGS. 9 and 10) to pivotally move the same in the horizontal plane. The other end of the operating lever 241 is in engagement with the previously mentioned clutch disc 204 (see FIG. 6) to bring the same into engagement with the cut-outs in the ring 442a on the end face of the gear 442 against the biasing force of the clutch spring 205.

As shown in FIG. 8, a release lever 242 is mounted to the outer side wall of the frame 135a for pivotal movement relative thereto about a pivot 461. The release lever 242 has a free end to which a roller 243 is rotatably mounted. A spring 244 is associated with the release lever 242 to resiliently urge the roller 243 against the periphery of the cam plate 223. As shown in FIGS. 8, 9, 10 and 14, the base end of the release lever 242 is connected to a base end of a release arm 189 through a clutch mechanism. The release arm 189 has a free end which is abutted against the free end of the arm 495 associated with the support rods 187 and 187 for the lower drive roller 184. Referring back to FIG. 8, the cam plate 223 is provided on its periphery with a projection 245 which is engageable with the roller 243 to pivotally move the release lever 242 in the counterclockwise direction about the pivot 461 as viewed in FIG. 8.

Figure 10:
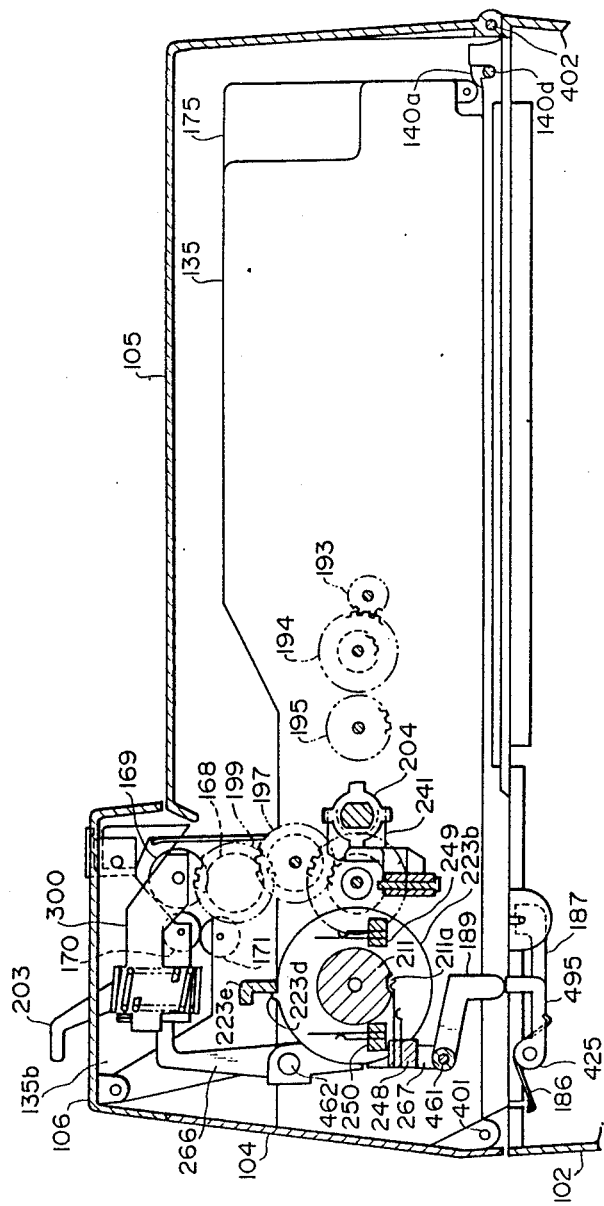
FIG. 10 is a fragmental cross-sectional view taken along line X—X in FIG. 6, showing a cam disc and associated various switches.

Additionally, as shown in FIGS. 6 and 9, an attaching plate 272 is mounted to the outer side wall of the frame 135a. Referring also to FIG. 10, attached to the attaching plate 272 are a switch 248 turned on and off in response to rotation of the cam roller 166, a re-exposure switch 249 turned on and off to energize and deenergize the exposure slit tube 147, and a switch 150 turned on and off to energize and deenergize the halogen lamp 109. In this connection, a cam plate 223b and a cam 211 are fixedly mounted to the end of the shaft for the cam roller 166. The cam plate 223b is provided on its periphery with a projection 223d engageable with a stopper lever 223e which is fixedly mounted to the aforesaid lever stopper 225. The cam 211 is formed in its periphery with a recess 211a engageable with the actuator pin of the switch 248. As clearly shown in FIG. 6, the shaft 456 for the cam plate 223 has an end projecting from the side wall of the lower casing section 102. An operating lever 252 in the form of a dial or disc is fixedly connected to the projecting end of the shaft 456 for operating the cam plate 223.

As shown in FIG. 11, a switch lever 257 has an upper end connected to the upper cover 106, and a lower end abutted against a pin of a switch 258. When the upper cover 106 is pivotally moved upwardly to its open position, the switch lever 257 is moved upwardly to permit the switch 258 to move its off-position thereby turning off the electric power source for the entire apparatus. Moreover, the switch lever 257 is moved upwardly also by movement of the front cover 104 together with the frame 135 to the open position. As shown in FIG. 4, a transformer 259 is arranged within the lower casing section 102 and below the light-diffusion plate 114.

Figure 13:
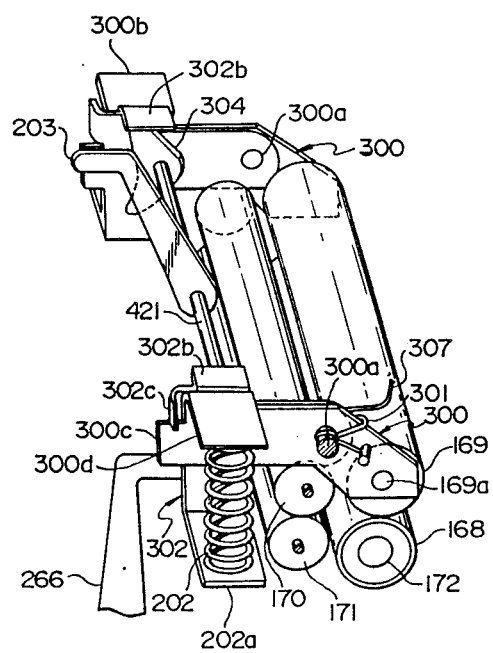
FIG. 13 is a fragmental perspective view of a mechanism for adjusting the nip pressure between the pair of heat-fixing rollers illustrated in FIG. 4.
Figure 14:
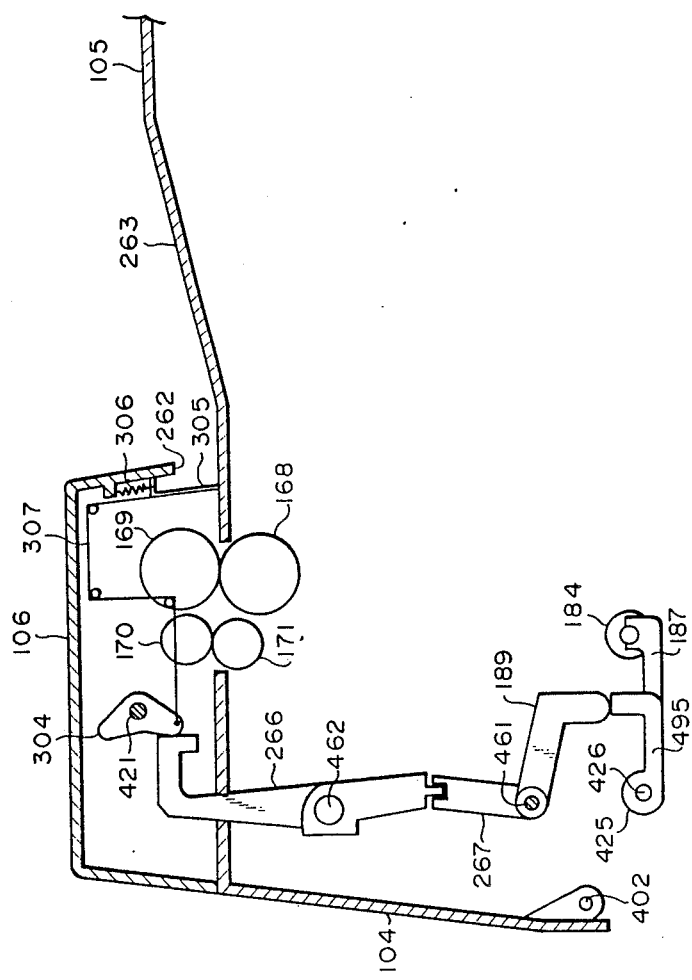
FIG. 14 is a fragmental cross-sectional view of a mechanism for moving a shutter for an external insertion opening, between open and closed positions.

Referring to FIGS. 10, 13 and 14, the switching lever 203 extends out of the upper cover 106 through an opening provided therein. A lever 266 is mounted to the front cover 104 for pivotal movement relative thereto about a pivot 462. The lever 266 has an upper end abutted against the lower end of one of the pair of cams 304 mounted to the shaft 421 to which the switching lever 203 is mounted. The lever 266 has a lower end pivotally connected to an upper end of a release sub-lever 267 which is pivotally mounted on the pivot 461. The release sub-lever 267 is connected to the release arm 189 for pivotal movement therewith about the pivot 461. The arrangement is such that when the switching lever 203 is operated to pivotally move the cams 304 from the illustrated position in the clockwise direction as viewed in FIG. 13 about the axis of the shaft 421, the lower end of the one cam 304 urges the upper end of the lever 266 to pivotally move the same in the counterclockwise direction about the pivot 462. The release arm 189 is pivotally moved in the clockwise direction to pivotally move the arm 495 as well as the support rods 187 against the biasing force of the spring 186 in the clockwise direction about the shaft 426, to move the lower feed roller 184 away from the upper feed roller 185. On the other hand, as the cam plates 304 are returned to their illustrated position by the switching lever 203, the lower feed roller 184 is urged against the upper feed roller 185 under the biasing force of the spring 186.

As shown mainly in FIGS. 4 and 14, an external insertion opening 262 is formed at the junction between the upper cover 106 and the rear cover 105. Any suitable articles requiring heat-treatment by the pair of heat-fixing rollers 168 and 169 can be inserted through the external insertion opening 262. In this connection, a guide 263 defines a predetermined transport path extending from the external insertion opening 262 toward and through the nip between the pair of heat-fixing rollers 168 and 169. A shutter 305 is arranged at the external insertion opening 262 and is movable between an open position where the opening 262 is opened and a closed position indicated in FIG. 14 where the opening 262 is closed. A coil spring 306 is interposed under compression between the shutter 305 and the upper cover 106 for biasing the shutter 305 toward the closed position. The lower end of the one cam 304 mounted to the shaft 421 to which the switching lever 203 is mounted, is connected to the shutter 205 by a wire cable 307. The arrangement is such that when the switching lever 203 is operated to pivotally move the one cam 304 about the axis of the shaft 421 in the clockwise direction as viewed in FIG. 14, the pivotal movement of the one cam 304 is transmitted to the shutter 305 through the wire cable 307 to move the shutter 305 to the open position against the biasing force of the spring 306.

The operation of the image recording apparatus shown in FIGS. 4 through 15 will be described below.

As the electric power source is turned on, the drive motor 190 rotates at a speed lower than that at heat-treatment for the article inserted through the external insertion opening 262. At the same time, the heater 172 for the lower heat-fixing roller 168 is turned on. For convenience of explanation, it is first supposed that the operating lever 252 is in the neutral position illustrated in FIG. 6, and the switching lever 203 is in the first position illustrated in FIG. 13. In the first position of the switching lever 203, the biasing force due only to the first spring 301 is applied to the upper heat-fixing roller 169 so that the relatively low nip pressure suitable for heat-treatment of the developing sheet 490 having carried thereon the developed image is applied to the nip between the pair of heat-fixing rollers 168 and 169. At this time, the external insertion opening 262 is closed by the shutter 305. The driving force from the drive motor 190 is transmitted to the heat-fixing rollers 168 and 169 and the feed-out rollers 170 and 171 through the gear train including the gears 194 through 201, so that the rollers 168, 169, 170 and 171 are driven to rotate. As the lower heat-fixing roller 168 heated by the heater 172 reaches a given temperature level, a ready lamp is turned on.

The original 412 is set on the frame 411 as shown in FIG. 15, and the frame 411 having set thereon the original 412 is inserted into the casing 101 through one of the openings 153. Moreover, the filter case 112 having set therein the color filter 269 is inserted into the filter box 111 through the filter inserting opening 113. It is of course that insertion of the frame 411 having set thereon the original 412 and insertion of the filter case 112 having set therein the color filter 269 may be effected before the ready lamp is turned on. When the filter case 112 having set therein the color filter 269 is inserted, the engaging pin 126 on the outer surface of the bottom of the filter case 112 is abutted against the shutter operating plate 118 to pivotally move the same as well as the gear 120 about the axis of the pivot 118a. Angular movement of the gear 120 causes the rack 121 to be moved horizontally leftwardly as viewed in FIG. 5 to angularly move the gear 125 about the axis of the pivot shaft 116. Thus, the shutter plate 115 fixedly mounted to the pivot shaft 116 is pivotally moved from its closed position to its open position as indicated by the arrow a in FIG. 4, so that the front opening 111a in the filter box 111 is opened.

Subsequently, the operating lever 252 is turned to angularly move the cam plate 223 in the direction indicated by the arrow b in FIG. 8, thereby bringing the forward end of the lever stopper 225 into engagement with the recess 224c in the cam plate 223. The operating arm 228 is urged by the boss 227 and is pivotally moved in the clockwise direction about the pivot 457 as viewed in FIG. 8 to horizontally move the operating plate 229 as well as the operating lever plate 231 leftwardly as viewed in FIG. 8. Leftward movement of the operating lever plate 231 causes the contact-plate assembly 131 to be moved downwardly, so that a longitudinal portion of the photo and pressure sensitive recording web 174 extending between the guide rollers 139a and 139b is brought into close contact with the original 412 set on the frame 411 which, in turn, is set on the platen 129. That is, the contact-plate assembly 131 is moved while describing an arc so that the rubber plate 134 of the contact-pressure assembly 131 brings the longitudinal portion of the recording web 174 into close contact with the original 412 without having the longitudinal portion of the recording web 174 rubbing against the original 412.

As the operating lever 252 is further turned to angularly move the cam plate 223 in the direction indicated by the arrow b, the boss 238 on the cam plate 223 pushes the actuator pin of the switch 250 to permit electric current to be supplied to the halogen lamp 109. Light from the halogen lamp 109 is transmitted through the color filter 269 and is diffused by the light-diffusion plate 114. The diffused light from the light-diffusion plate 114 is directed to the original 412 through the transparent platen 129. Light transmitted through the original 412 shines on the longitudinal portion of the recording web 174. Thus, a latent image corresponding to the image information on the original 412 is formed onto the longitudinal portion of the recording web 174.

When it is desired that exposure is effected twice, the operating lever 252 is returned to the neutral position, and another original is substituted for the original 412. The operating lever 252 is then again turned in a manner like that described above.

After exposure of the longitudinal portion of the recording web 174, a developing sheet 490 is inserted through the external insertion opening 179 formed in the wall of the front cover 104, until the leading edge of the developing sheet 490 is abutted against the stopper 182. After insertion of the developing sheet 490, the operating lever 252 is turned to angularly move the cam plate 223 in the direction opposite to the direction indicated by the arrow b in FIG. 8, to bring the forward end of the lever stopper 225 into engagement with the cut-out 224a. Then, the boss 238 is brought into engagement with the clutch lever 239 (see FIG. 9) to pivotally move the operating lever 241 in the horizontal plane so that the clutch disc 204 is engaged with the cut-outs in the ring 442a on the end face of the gear 442. Thus, the driving force from the drive motor 190 is transmitted to the pressurizing and developing rollers 160 and 161.

Angular movement of the cam plate 223 in the direction opposite to the direction indicated by the arrow b also causes the projection 245 to push the roller 243 to pivotally move the release lever 242 in the counterclockwise direction as viewed in FIG. 8 about the pivot 461. As a consequence, the release arm 189 is pivotally moved in the counterclockwise direction as viewed in FIG. 10 about the pivot 461 to permit the arm 495 as well as the support rods 187 to be pivotally moved in the counterclockwise direction as viewed in FIGS. 8 and 10 under the action of the spring 186. Thus, the lower feed roller 184 partially projects out of the recess 183 to disengage the leading edge of the developing sheet 490 from the stopper 182. At the same time, the lower feed roller 184 cooperates with the upper feed roller 185 to clamp therebetween the developing sheet 490. On the other hand, the driving force from the drive motor 190 is transmitted to the upper feed roller 185 through the drive gear 196, the coupler gear 206, the developing roller 160, the supply idle gears 214 and 215 and the supply gear 216. Accordingly, the developing sheet 490 clamped between the upper and lower feed rollers 185 and 184 is transported thereby along the predetermined transport path toward the nip between the pair of pressurizing and developing rollers 160 and 161.

The longitudinal portion, having carried thereon the latent image, of the photo and pressure sensitive recording web 174 is transported toward the nip between the pair of pressurizing and developing rollers 160 and 160, in synchronism with transportation of the developing sheet 490 toward the nip between the pressurizing and developing rollers 160 and 161. Specifically, the recording web 174 is wound around the recoiler 177 at the speed in synchronism with that at which the developing sheet 490 is transported, by the feed roller 178 driven to rotate by the driving force from the drive motor 190 transmitted through the drive gear 208, the idle gear 270 and the roll gear 271.

The driving force rotatively driving the pair of pressurizing and developing rollers 160 and 161 is transmitted from the coupler gear 206 to the cam plate 223b through the gear train including the gears 209, 452 and 210, to angularly move the cam plate 223b as well as the cam 211 about the axis of the shaft for the cam roller 166. Angular movement of the cam 211 causes the switch 249 for the exposure slit tube 147 to be turned on. At the same time, the cam roller 166 is rotated by the driving force transmitted from the coupler gear 206, to disengage the rollers 165 and 165 from the respective cam grooves 167 and 167 formed in the cam roller 166, thereby urge the pressurizing and developing roller 160 against the pressurizing and developing roller 161. During one revolution of the cam roller 166, the developing sheet 490 and the longitudinal portion of the recording web 174 are caused to pass under pressure through the nip between the pair of pressurizing and developing rollers 160 and 161, with the developing sheet 490 and the longitudinal portion of the recording web 174 superposed on upon the other. During passage of the developing sheet 490 and the longitudinal portion of the recording web 174 through the nip between the pressurizing and developing rollers 160 and 161, uncured microcapsules on the exposed side of the longitudinal portion of the recording web 174 are ruptured so that dye precursors are squeezed out of the ruptured microcapsules. The dye precursors squeezed out of the ruptured microcapsules react with developer coated on the developing sheet 490 so that an image corresponding to the latent image on the recording web 174 is developed onto the developing sheet 490.

After development, the developing sheet 490 having carried thereon the developed image is transported along the predetermined transport path toward the nip between the pair of heat-fixing rollers 168 and 169. On the other hand, the photo and pressure sensitive recording web 174 after development of the latent image onto the developing sheet 490 is fed out by the feed roller 178 and is wound around the recoiler 177. As described previously, the diameter of the pulley gear 218 and the diameter of the core pulley 220 are set such that the amount by which the recording web 174 is wound around the recoiler 177 is more than that by which the recording web 174 is fed by the feed roller 178. Accordingly, the recording web 174 is prevented from slackening or loosening.

Since the pressure development of one developing sheet 490 due to the pressurizing and developing rollers 160 and 161 is matched to one revolution of the cam roller 166, the pressure development is completed when the rollers 165 and 165 are again brought into fitting engagement with the respective cam grooves 167 and 167. At the same time, the projection 223d on the cam plate 223b pushes the stopper lever 223e up to pivotally move the lever stopper 225 in the counterclockwise direction as viewed in FIG. 8 about the pivot 462. Thus, the cam plate 223 is returned to its neutral position indicated in FIG. 8. At the same time, the clutch disc 204 is disengaged from the cut-outs in the ring 442a on the face of the gear 442. Further, the actuator pin of the cam switch 248 is brought into engagement with the recess 211a in the cam 211 so that the switch 248 is turned off. When the switch 248 is turned off, the voltage applied to the drive motor 190 is lowered to enable the drive motor 190 to have a long service life.

The developing sheet 490 having carried thereon the developed image is transported to the heat-fixing station D. Specifically, the developing sheet 490 is caused to pass through the nip between the pair of heat-fixing rollers 168 and 169 and is heated thereby. Thus, the image on the developing sheet 490 is fixed by the heat-fixing rollers 168 and 169 and is recorded onto the developing sheet 490. The developing sheet 490 having carried thereon the fixed and recorded image is fed under tension by the pair of feed-out rollers 170 and 171 while being lowered in temperature to prevent the developing sheet 490 from being curled up. Subsequently, the developing sheet 490 is discharged out of the casing 101 through the discharge opening 264.

When it is desired to carry out the laminating treatment of articles such as, for example, ones illustrated in FIGS. 1 and 3, the switching lever 203 is pivotally moved in the clockwise direction as viewed in FIG. 13 about the axis of the shaft 421 from the illustrated first position to the second position. Pivotal movement of the switching lever 203 causes the cams 304 to be pivotally moved in the clockwise direction about the axis of the shaft 421 to pivotally move the lever 266 in the counterclockwise direction about the pivot 462. Through the release sub-lever 267, the release arm 189 is pivotally moved in the clockwise direction about the pivot 461 to pivotally move the arm 495 as well as the support rods 187 and 187 in the clockwise direction against the action of the spring 186. Thus, the lower feed roller 184 is moved to the position accommodated in the recess 183 formed in the guide plate 180, to permit the leading edge of the developing sheet 490 to be inserted through the external insertion opening 179 to be brought into engagement with the stopper 182, thereby preventing the developing sheet 490 from being transported through the predetermined transport path extending through the nip between the pair of pressurizing and developing rollers 160 and 161.

Pivotal movement of the cams 304 due to pivotal movement of the switching lever 203 from the first position to the second position, is transmitted to the shutter 305 through the wire cable 307, to move the shutter 305 from the closed position to the open position against the biasing force of the spring 306. Thus, the external insertion opening 262 is opened to permit the article to be transported along the predetermined transport path extending through the nip between the pair of heat-fixing rollers 168 and 169.

Moreover, pivotal movement of the cams 304 due to pivotal movement of the switching lever 203 from the first position to the second position, causes the spring retainers 302 to be pivotally moved in the clockwise direction as viewed in FIG. 13 about the respective pins 300a, thereby compressing the respective second springs 202. As a consequence, the biasing force at the second level, that is the sum of the biasing force of the first spring 301 and the biasing force of the second springs 202, is applied to the upper heat-fixing roller 169. Thus, the nip pressure at the second level suitable for laminating treatment of the article to be inserted through the external insertion opening 262 is applied to the nip between the pair of heat-fixing rollers 168 and 169. When the switching lever 203 is in the second position, the article such as one illustrated in FIG. 1 or FIG. 3 is inserted through the external insertion opening 262 and is transported along the predetermined transport path extending through the nip between the pair of heat-fixing rollers 168 and 169. The article is caused to pass through the nip between the heat-fixing rollers 168 and 169 and is subjected to heat treatment thereby.

If jamming of the developing sheet 490 fed from the pair of pressurizing and developing rollers 160 and 161 or the article inserted through the external insertion opening 262 occurs at the heat-fixing station D, the upper cover 106 is pivotally moved about the pivot 403 to the open position, to move the upper heat-fixing roller 169 and the upper feed-out roller 170 respectively away from the lower heat-fixing roller 168 and the lower feed-out roller 171. Thus, it is possible to remove the developing sheet 490 or the article with which the heat-fixing station D is jammed.

It is needless to say that three or more predetermined transport paths along each of which articles necessitating heat treatment by the heat-fixing rollers 168 and 169 can travel, may extend through the nip between the pair of heat-fixing rollers 168 and 169, as occasion demands. Further, a plurality of developing sheets 490 may be accommodated in a sheet cassette like the sheet cassette 28 shown in FIG. 2. In this case, it is unnecessary that the external insertion opening 179 for the developing sheets is formed in the casing 101.

As described above, the arrangement of the modification illustrated in FIGS. 4 through 15 is such that, in accordance with the level of the nip pressure between the pair of heat-treatment or heat-fixing rollers 168 and 169, an article is permitted to travel along only a selected one of the predetermined transport paths which are different from each other and which extend through the nip between the heat-treatment rollers 168 and 169, and an article is prohibited from traveling along the other predetermined transport path. With such arrangement, it is possible to obviate various inconveniences occurring when the nip pressure between the pair of heat-treatment rollers 168 and 169 is not in conformity with the purpose for which the article is caused to pass through the nip between the heat-treatment rollers 168 and 169.

Figure 17:
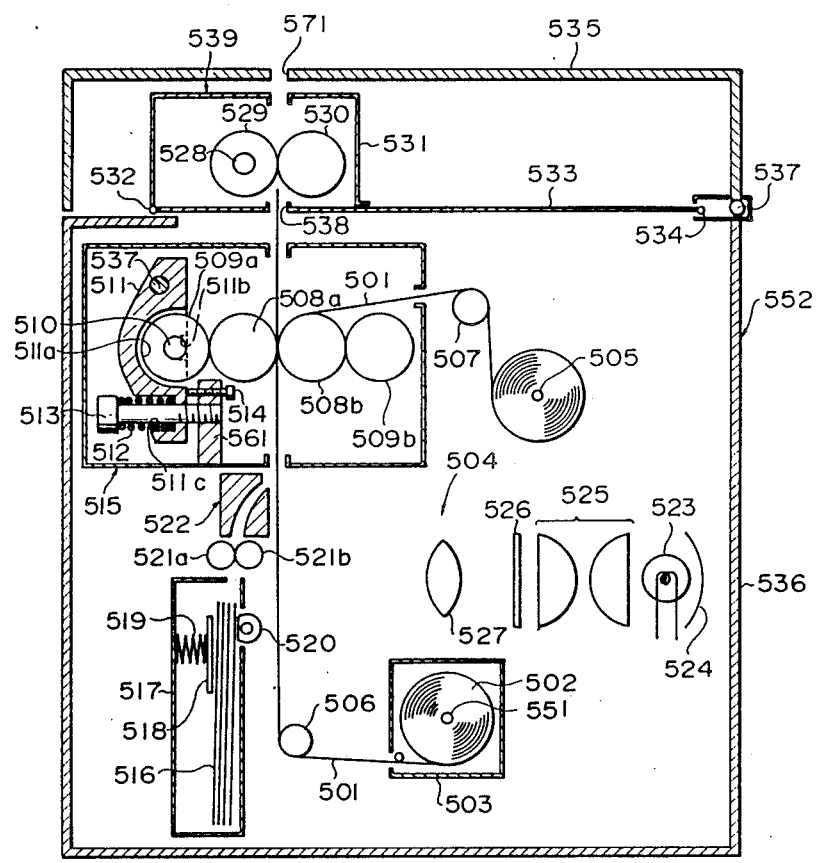
FIG. 17 is a schematic structural cross-sectional view of an image recording apparatus according to another modification of the invention, which comprises a heat-insulator arranged between a pair of heat-fixing rollers and a pair of pressurizing and developing rollers.

Referring to FIG. 17, there is shown another modification of the image recording apparatus. A continuous photo and pressure sensitive recording web 501 is wound into a roll 502 around a core 551. The roll 502 is accommodated in a roll cassette 503 detachably mounted at a lower location within a casing body 536 of a casing 552. A guide roller 506 is arranged adjacent an outlet opening of the roll cassette 503. The recording web 501 unwound from the roll 502 and drawn out of the roll cassette 503 is transported along a predetermined traveling path. Specifically, the recording web 501 is first drawn out of the roll cassette 503 substantially horizontally. The recording web 501 is then guided by the guide roller 506 and extends substantially vertically through an exposure station 504. Subsequently, the recording web 501 is caused to enter a pressure-fixing unit 515 in which the recording web 501 is caused to pass through a nip defined between a pair of pressurizing and developing rollers 508a and 508b, is changed in course by the right-hand roller 508b. The recording web 501 then passes around a drive roller 507 and is wound around a take-up roller 505.

The exposure station 504 is arranged upstream of the nip between the pair of pressurizing and developing rollers 508a and 508b with reference to a traveling direction of the photo and pressure sensitive recording web 501 along the predetermined traveling path. At the exposure station 504, a halogen lamp 523 is arranged which serves as a light source. A reflector 524 is located behind the halogen lamp 524 to reflect light therefrom. The light from the halogen lamp 523 and reflected by the reflector 524 passes along a predetermined optical path toward a longitudinal portion of the recording web 501 at the exposure station 504. Arranged on the optical path are a condenser lens system 525 including a pair of condenser lenses, a transparent original 526 such as, for example, a slide having image information, and an imaging lens 527.

The pair of pressurizing and developing rollers 508a and 508b within the pressure-fixing unit 515 are arranged in a horizontal plane above the exposure station 504. More specifically, the pair of pressurizing and developing rollers 508a and 508b have their respective axes extending in the horizontal plane in parallel relation to each other. A pair of backup rollers 509a and 509b are associated respectively with the pair of pressurizing and developing rollers 508a and 508b. The backup roller 509a is rotatable about its own axis and is movable toward and away from the pressurizing and developing roller 508a, while the backup roller 509b is rotatable about its own axis, but is immovable toward and away from the pressurizing and developing roller 508b.

The pressure-fixing unit 515 has incorporated therein an urging arrangement which comprises a pivot 537 having an axis extending parallel to the axes of the respective pressurizing and developing rollers 508a and 508b. A lever 511 is mounted at its one end on the pivot 537 for pivotal movement about an axis thereof. The lever 511 is formed therein with a recess 511a at a location between the one and other ends of the lever 511. A pair of opposed U-shaped grooves 511b (only one shown in FIG. 17) are also provided in the lever 511 at the recess 511a. A shaft 510, on which the backup roller 509a is mounted, is rotatably received in the pair of U-shaped grooves 511b in such a manner that the backup roller 509a is accommodated in the recess 511a. A bore 511c having a bottom wall is formed in the lever 511 adjacent the other end thereof. An adjusting screw 513 passes through the bottom wall of the bore 511c and has a forward end threadedly engaged with a bracket 561 secured to a housing of the pressure-fixing unit 515. A coil spring 512 is arranged around the adjusting screw 513 and is interposed under compression between a head of the adjusting screw 513 and the bottom wall of the bore 511c. The lever 511 is abutted against the forward end of a stopper 514 in the form of a bolt, under the action of the coil spring 512. The stopper 514 is threadedly engaged with the bracket 561 in such a manner that the projecting length of the stopper 514 from the bracket 533 is adjustable. When the recording web 501 and a developing sheet 516 subsequently to be described are superposed one upon the other and are caused to pass through the nip between the pair of pressurizing and developing rollers 508a and 508b, the backup roller 509a is urged against the pressurizing and developing roller 508a which, in turn, is urged against the pressurizing and developing roller 508b backed up by the backup roller 509b. Screwing or unscrewing of the adjusting screw 513 with respect to the bracket 561 enables biasing force of the coil spring 512 to be varied, thereby adjusting the urging force by which the backup roller 509a is urged against the pressurizing and developing roller 508a.

A sheet feed cassette 517 is detachably mounted within the casing body 536, and is arranged below the pressurizing and developing unit 515. In the sheet feed cassette 517, a stack of a plurality of developing cut sheets 516 is accommodated substantially vertically. The stack of developing sheets 516 is resiliently urged against one of the opposite side walls of the sheet cassette 517 by a coil spring 519 through a sheet pusher plate 518. The developing sheets 516 within the sheet feed cassette 517 are fed one by one by a sheet feed roller 520 having a generally semi-circular cross-sectional shape, along a predetermined transport path. The predetermined transport path for the developing sheets 516 extends through a nip between a pair of feed rollers 521a and 521b, through a sheet guide member 522, and through the nip between the pair of pressurizing and developing rollers 508a and 508b.

A heat-fixing unit 539 is arranged within a cover section 535 of the casing 552, and is located above the pressure and developing unit 515. The heat-fixing unit 539 includes a pair of heat-fixing rollers 529 and 530 defining a nip therebetween which is located just above the nip between the pair of pressurizing and developing rollers 508a and 508b. The predetermined transport path for the developing sheets 516 extends through the nip between the heat-fixing rollers 529 and 530. One of the heat-fixing rollers 529 is incorporated therein a heater 528 for heating the heat-fixing roller 529. The other heat-fixing roller 530 is formed by a rubber roller. The heat-fixing rollers 529 and 530 are accommodated within a protect cover 531 which is pivotally mounted to a support plate 533 about a pivot 532.

The support plate 533 is arranged between the heat-fixing unit 539 and the pressurizing and developing unit 515, and extends substantially horizontally. The support plate 533 is mounted to the top of the casing body 536 for pivotal movement about a pivot 534. The support plate 533 serves as a partition wall separating the heat-fixing unit 539 and the pressurizing and developing unit 530 from each other. The support plate 533 serves also as a heat insulator for insulating radiation of heat from the pair of heat-fixing rollers 529 and 530 to the pair of pressurizing and developing rollers 508a and 508b. The support plate 533 is formed therein with a slit-like slot 538 through which the predetermined transport path for the developing sheets 516 extends substantially vertically.

The cover section 535 of the casing 552 is mounted to the top of the casing body 536 for pivotal movement relative thereto about a pivot 537. The heat-fixing unit 539 is surrounded by the cover section 535.

The operation of the image recording apparatus illustrated in FIG. 16 will next be described below.

The photo and pressure sensitive recording web 501 is unwound from the roll 502, and a longitudinal fresh portion of the recording web 501 is brought to the exposure station 504. The exposure halogen lamp 523 is turned on, and light from the lamp 523 passes through the condenser lens system 525, and then through the original 526 along the optical path. The longitudinal portion of the recording web 501 is illuminated with the light passing through the original 526, so that a latent image corresponding to the image information on the original 526 is formed onto the longitudinal portion of the recording web 501. The recording web 501 is transported along the predetermined traveling path, and the longitudinal portion of the recording web 501 having carried thereon the latent image travels toward the nip between the pair of pressurizing and developing rollers 508a and 508b within the pressurizing and developing unit 515. In synchronism with traveling of the longitudinal portion of the recording web 501 toward the nip between the rollers 508a and 508b, the developing sheet 516 is fed out of the sheet cassette 517 by the sheet feed roller 520, and is transported by the pair of feed rollers 521a and 521b along the predetermined transport path toward the nip between the pair of pressurizing and developing rollers 508a and 508b through the guide member 522. The longitudinal portion of the recording web 501 and the developing sheet 516 are caused to pass through the nip between the pressurizing and developing rollers 508a and 508b, with the longitudinal portion of the web 501 and the developing sheet 516 superposed upon each other.

Before the recording web 501 and the developing sheet 516 superposed one upon the other are caused to pass through the nip between the pressurizing and developing rollers 508a and 508b, the gap between the rollers 508a and 508b is adjusted by the stopper 514 such that the gap is wider than the thickness of the recording web 501, but is narrower than the sum of the thickness of the recording web 501 and the thickness of the developing sheet 516. Accordingly, as the recording web 501 and the developing sheet 516 superposed one upon the other are bitten into the nip between the pressurizing and developing rollers 508a and 508b, the lever 511 is slightly moved pivotally in the clockwise direction as viewed in FIG. 16 about the pivot 537. At this time, the lever 511 is disengaged from the stopper 514, so that the lever 511 is biased by the spring 512 to urge the backup roller 509a against the pressurizing and developing roller 508a. In this manner, the pair of pressurizing and developing rollers 508a and 508b cooperate with each other to apply the pressure determined by the biasing force of the coil spring 512, to the longitudinal portion of the recording web 501 and the developing sheet 516 to develop the latent image on the longitudinal portion of the recording web 501 onto the developing sheet 516. Thus, an image corresponding to the latent image on the longitudinal portion of the recording web 501 is developed onto the developing sheet 516.

After the development, the recording web 501 is transported by the drive roller 507 and is wound around the take-up roller 505. On the other hand, the developing sheet 516 having carried thereon the developed image continues to travel along the predetermined transport path. That is, the developing sheet 516 passes through the opening 538 formed in the support plate 533, and is caused to pass through the nip between the pair of heat-fixing rollers 529 and 530. The heat-fixing rollers 529 and 530 cooperate with each other to heat and fix the developed image on the developing sheet 516, onto the latter. The developing sheet 516 having carried thereon the fixed image is discharged out of the casing 552 through a discharge opening 571 formed in the top of the cover section 535 of the casing 552. During heat-fixing due to the heat-fixing rollers 529 and 530, the support plate 533 insulates radiation of heat from the heat-fixing unit 539 to the nip between the pressurizing and developing rollers 508a and 508b.

As described above, the arrangement of the modification illustrated in FIG. 17 is such that the heat insulator formed by the support plate 533 is provided between the heat-fixing unit 539 and the pressurizing and developing unit 515, for insulating radiation of heat from the heat-fixing unit 539 to the pressurizing and developing unit 515. This makes it possible to carry out the pressure development of the developing sheet 516 in a stable manner. Moreover, the heat insulator effectively prevents the various component parts arranged below the heat insulator from being heated excessively, making it possible to use the image recording apparatus for a long period of time in a stable manner.

What is claimed is:

1. An image recording apparatus utilizing a developing sheet, which comprises:
   a housing provided in its wall with an external insertion opening;
   a pair of heat-treatment rollers arranged within said housing, said pair of heat-treatment rollers defining therebetween a nip;
   means for defining a first predetermined transport paths which extends through the nip between said pair of heat-treatment rollers, said developing sheet having carried thereon an image being transported along said first predetermined transport path, wherein said developing sheet is caused to pass through the nip between said pair of heat-treatment rollers and is heat-treated thereby so that the image on said developing sheet is fixed and recorded onto said developing sheet;
   means for defining a second predetermined transport path extending through the nip between said pair of heat-treatment rollers, said second predetermined transport path being different from said first predetermined transport path and extending from said external insertion opening, wherein an article inserted through said external insertion opening can travel along said second predetermined transport path so that the article is caused to pass through the nip between said pair of heat-treatment rollers and is heat-treated thereby.

2. The image recording apparatus according to claim 1, wherein said pair of heat-treatment rollers are arranged at an upper location within said housing, and wherein said wall provided therein with said external insertion opening is a top wall of said housing.

3. The image recording apparatus according to claim 2, wherein the article inserted through said external insertion opening is comprised of a sheet-like carrier, an image sheet having carried thereon an image, and hot-melt adhesive material arranged between said carrier and said image sheet, and wherein said carrier and said image sheet are superposed one upon the other, travel along said second predetermined transport path and are caused to pass through the nip between said pair of heat-treatment rollers so that said carrier and said image sheet are stuck together with said hot-melt adhesive material.

4. The image recording apparatus according to claim 3, wherein the developing sheet is utilized as said image sheet.

5. The image recording apparatus according to claim 4, further comprising a sheet feed cassette accommodating a stack of a plurality of developing sheets, and means for feeding the developing sheets one by one from said sheet feed cassette along said first predetermined transport path.

6. The image recording apparatus according to claim 5, further comprising a pair of pressurizing and developing rollers defining therebetween a nip, and means for defining a predetermined traveling path along which a photo-sensitive recording medium travels, said first predetermined transport path extending through the nip between said pair of pressurizing and developing rollers which are arranged upstream of said pair of heat-treatment rollers with reference to a transport direction of the developing sheet along said first predetermined transport path, wherein said predetermined traveling path, along which said photo-sensitive recording medium travels, extends through the nip between said pair of pressurizing and developing rollers, said photo-sensitive recording medium having carried thereon a latent image, wherein said photosensitive recording medium having carried thereon said latent image and said developing sheet are caused to pass through the nip between said pair of pressurizing and developing rollers, with said photo-sensitive recording medium and said developing sheet superposed upon each other, and wherein said pair of pressurizing and developing rollers cooperate with each other to apply pressure to said photo-sensitive recording medium and said developing sheet caused to pass through the nip between said pressurizing and developing rollers, to develop said latent image on said photo-sensitive recording medium, onto said developing sheet.

7. The image recording apparatus according to claim 6, wherein said photo-sensitive recording medium is comprised of a continuous photo-sensitive recording web wound into a roll, said photo-sensitive recording web unwound from said roll traveling along said predetermined traveling path extending through the nip between said pair of pressurizing and developing rollers.

8. The image recording apparatus according to claim 7, further comprising an exposure station arranged upstream of the nip between said pair of pressurizing and developing rollers with reference to a traveling direction of said photo-sensitive recording web along said predetermined traveling path, said exposure station including a platen on which an original having image information is set, and exposure means for exposing the original on said platen to form said latent image corresponding to the image information on the original, onto a longitudinal portion of said photo-sensitive recording web.

9. The image recording apparatus according to claim 8, wherein said exposure station further includes a contact-plate means movable between an operative position where said contact-plate means urges said original against said platen to bring said original into close contact with said platen, and an inoperative position where said contact-plate means is spaced from said platen, and drive means for moving said contact-plate means between said operative and inoperative positions.

10. The image recording apparatus according to claim 9, wherein said drive means comprises a connecting rod having one end thereof pivotally connected to said contact-plate means, and a rotatable disc member having an end face to which the other end of said connecting rod is pivotally connected.

11. An image recording apparatus which comprises:
a housing;
a pair of heat-treatment rollers arranged within said housing, said pair of heat-treatment rollers defining therebetween a nip;
means for heating at least one of said pair of heat-treatment rollers;
pressure-adjusting means for adjusting nip pressure between said pair of heat-treatment rollers;
means for defining at least first and second predetermined transport paths which extend within said housing and which are different from each other, said first and second predetermined transport paths passing through the nip between said pair of heat-treatment rollers; and
path-selecting means for permitting an article to travel along only a selected one of said first and second predetermined transport paths in accordance with a level of the nip pressure between said pair of heat-treatment rollers adjusted by said pressure-adjusting means, an for prohibiting an article from traveling along the remaining at least one predetermined transport path.

12. The image recording apparatus according to claim 11, wherein said housing is provided in its wall with an external insertion opening, an article inserted through said external insertion opening being capable of traveling along said first predetermined transport path.

13. The image recording apparatus according to claim 12, wherein said pair of heat-treatment rollers are arranged at an upper location within said housing, and wherein said wall provided therein with said external insertion opening is a top wall of said housing.

14. The image recording apparatus according to claim 12, wherein said housing is provided in its wall with a second external insertion opening, an article inserted through said second external insertion opening being capable of traveling along said second predetermined transport path.

15. The image recording apparatus according to claim 14, wherein said wall provided therein with said second external insertion opening is a side wall of said housing.

16. The image recording apparatus according to claim 14, wherein the article inserted through the first-mentioned external insertion opening is comprised of a sheet-like carrier, an image sheet having carried thereon an image, and hot-melt adhesive material arranged between said carrier and said image sheet, and wherein said carrier and said image sheet are superposed one upon the other, travel along said first predetermined transport path and are caused to pass through the nip between said pair of heat-treatment rollers so that said carrier and said image sheet are stuck together with said hot-melt adhesive material, and wherein the article inserted through said second external insertion opening is a developing sheet.

17. The image recording apparatus according to claim 12, wherein said path-selecting means comprises a shutter means movable between an open position wherein said shutter means opens said external insertion opening to permit the article to travel along said first predetermined transport path and a closed position where said shutter means closes said external insertion opening to prevent the article to travel along said first predetermined transport path.

18. The image recording apparatus according to claim 17, wherein said path-selecting means further comprises stopper means located on said second predetermined transport path, the article being engageable with said stopper means so as to be stopped thereby, and disengaging means movable between a first position permitting the article to be brought into engagement with said stopper means and a second position disengaging the article from said stopper means to permit the article to travel along said second transport means.

19. The image recording apparatus according to claim 18, wherein said disengaging means moves to said first and second positions in response respectively to movement of said shutter means to said open and closed positions.

20. The image recording apparatus according to claim 19, further comprises a pair of drive rollers arranged on said second predetermined transport path, at least one of said pair of drive rollers being movable toward and away from the other drive roller between an operative position where the one drive roller cooperates with the other drive roller to clamp therebetween the article to impart driving force to the same thereby transporting the article along said second predetermined path, and an inoperative position where the one drive roller is spaced from the other drive roller to impart no driving force to the article.

21. The image recording apparatus according to claim 20, wherein the one drive roller serves as said disengaging means.

22. The image recording apparatus according to claim 21, further comprises a guide member defining said second predetermined transport path, said guide member being provided with a recess, wherein the one drive roller is accommodated in said recess when the one drive roller is in said inoperative position, and at least a part of the one drive roller projects out of said recess when the one drive roller is in said operative position.

23. The image recording apparatus according to claim 22, wherein said housing is provided in its wall with a second external insertion opening, an article inserted through said second external insertion opening being capable of traveling along said second predetermined transport path.

24. The image recording apparatus according to claim 22, wherein said wall provided therein with said second external insertion opening is a side wall of said housing.

25. The image recording apparatus according to claim 23, wherein the article inserted through the first-mentioned external insertion opening is comprised of a sheet-like carrier, an image sheet having carried thereon an image, and hot-melt adhesive material arranged between said carrier and said image sheet, and wherein said carrier and said image sheet are superposed one upon the other, travel along said first predetermined transport path and are caused to pass through the nip between said pair of heat-treatment rollers so that said carrier and said image sheet are stuck together with said hot-melt adhesive material, and wherein the article inserted through said second external insertion opening is a developing sheet.

26. The image recording apparatus according to claim 25, wherein said pair of heat-treatment rollers are arranged at an upper location within said housing, and wherein said wall provided therein with the first-mentioned external insertion opening is a top wall of said housing.

27. The image recording apparatus according to claim 26, wherein said wall provided therein with said second external insertion opening is a side wall of said housing.

28. The image recording apparatus according to claim 11, wherein said pressure-adjusting means comprises spring means associated with at least one of said pair of heat-treatment rollers for applying biasing force to the one heat-treatment roller thereby resiliently urge said pair of heat-treatment rollers against each other, and lever means associated with said spring means for switching the biasing force of said spring means applied to the one heat-treatment roller, between a first level and a second level higher than the same.

29. The image recording apparatus according to claim 28, wherein said spring means comprises a pair of first and second spring means, and wherein said lever means is movable between a first position where biasing force at said first level including only the biasing force of said first spring means is applied to the one heat-treatment roller and a second position where biasing force at said second level, which is the sum of the biasing forces of the respective first and second spring means, is applied to the one heat-treatment roller.

30. The image recording apparatus according to claim 29, wherein said second spring means is higher in biasing force than said first spring means.

31. The image recording apparatus according to claim 30, wherein said pressure-adjusting means comprises support-plate means pivotally movable about a pivotal axis, the one heat-treatment roller being rotatably mounted to said support-plate means, and spring-retainer means having associated therewith said lever means, said spring-retainer means mounted to said support-plate means for pivotal movement about said pivotal axis when said lever means is moved between said first and second positions, said first spring means being associated with said support-plate means, and said second spring means being arranged between said support-plate means and said spring-retainer means.

32. The image recording apparatus according to claim 31, wherein said support-plate means is provided with engaging projection means, and said spring-retainer means is provided with engaging projection means, wherein said engaging projection means of said support-plate means and said engaging projection means of said spring-retainer means are in engagement with each other by said second spring means when said lever means is in said first position, and wherein said spring-retainer means pivotally moves about said pivotal axis when said lever means moves from said first position to said second position, to compress said second spring means.

33. The image recording apparatus according to claim 32, wherein said pressure-adjusting means comprises a shaft on which said lever is mounted for angular movement together with said shaft about an axis thereof, and cam-plate means mounted on said shaft for angular movement together with the same about the axis of said shaft, and wherein said cam-plate means is brought into engagement with said spring-retainer means when said lever means moves from said first position to said second position, to angularly move said spring-retainer means about said pivotal axis, thereby compressing said second spring means.

34. The image recording apparatus according to claim 33, wherein said housing is provided in its wall with an external insertion opening, an article inserted through said external insertion opening being capable of traveling along said first predetermined transport path.

35. The image recording apparatus according to claim 34, wherein said pair of heat-treatment rollers are arranged at an upper location within said housing, and wherein said wall provided therein with said external insertion opening is a top wall of said housing.

36. The image recording apparatus according to claim 34, wherein said housing is provided in its wall with a second external insertion opening, an article inserted through said second external insertion opening being capable of traveling along said second predetermined transport path.

37. The image recording apparatus according to claim 36, wherein said wall provided therein with said second external insertion opening is a side wall of said housing.

38. The image recording apparatus according to claim 34, wherein said path-selecting means comprises a shutter means movable between an open position wherein said shutter means opens said external insertion opening to permit an article to be transported along said first predetermined transport path and a closed position where said shutter means closes said external insertion opening to prevent the article to be transported along said first predetermined transport path.

39. The image recording apparatus according to claim 38, wherein said path-selecting means comprises means for operatively connecting said lever means to said shutter means, and wherein said shutter means occupies said closed position when said lever means is in said first position, and said shutter means occupies said open position when said lever means is in said second position.

40. The image recording apparatus according to claim 39, wherein said path-selecting means further comprises stopper means located on said second predetermined transport path, the article being engageable with said stopper means so as to be stopped thereby, and disengaging means movable between a first position permitting the article to be brought into engagement with said stopper means and a second position disengaging the article from said stopper means to permit the article to be transported along said second transport means.

41. The image recording apparatus according to claim 40, wherein said path-selecting means comprises means for operatively connecting said lever means to said disengaging means, and wherein said disengaging means occupies its second position when said lever means is in its first position, and said disengaging means occupies its first position when said lever means is in said second position.

42. The image recording apparatus according to claim 41, wherein said housing is provided in its wall with a second external insertion opening, an article inserted through said second external insertion opening being capable of traveling along said second predetermined transport path.

43. The image recording apparatus according to claim 42, wherein said wall provided therein with said second external insertion opening is a side wall of said housing.

44. The image recording apparatus according to claim 43, wherein the article inserted through the first-mentioned external insertion opening is comprised of a sheet-like carrier, an image sheet having carried thereon an image, and hot-melt adhesive material arranged between said carrier and said image sheet, and wherein said carrier and said image sheet are superposed one upon the other, travel along said first predetermined transport path and are caused to pass through the nip between said pair of heat-treatment rollers so that said carrier and said image sheet are stuck together with said hot-melt adhesive material, and wherein the article inserted through said second external insertion opening is a developing sheet.

45. The image recording apparatus according to claim 44, further comprising a pair of pressurizing and developing rollers defining therebetween a nip, and means for defining a predetermined traveling path along which a photo-sensitive recording medium travels, said second predetermined transport path extending through the nip between said pair of pressurizing and developing rollers which are arranged upstream of said pair of heat-treatment roller with reference to a transport direction of the developing sheet along said second predetermined transport path, wherein said predetermined traveling path, along which said photo-sensitive recording medium travels, extends through the nip between said pair of pressurizing and developing rollers, said photo-sensitive recording medium having carried thereon a latent image, wherein said photosensitive recording medium having carried thereon said latent image and said developing sheet are caused to pass through the nip between said pair of pressurizing and developing rollers, with said photo-sensitive recording medium and said developing sheet superposed upon each other, wherein said pair of pressurizing and developing rollers cooperate with each other to apply pressure to said photo-sensitive recording medium and said developing sheet caused to pass through the nip between said pressurizing and developing rollers, to develop said latent image on said photo-sensitive recording medium, onto said developing sheet, wherein said developing sheet having carried thereon the developed image is caused to pass through the nip between said heat-treatment rollers, and said pair of heat-treatment rollers cooperate with each other to fix the image on said developing sheet caused to pass through the nip between said heat-treatment rollers.

46. The image recording apparatus according to claim 45, wherein said developing sheet having carried thereon the fixed image is utilized as said image sheet of the article to be inserted through the first-mentioned external insertion opening.

47. The image recording apparatus according to claim 46, wherein said photo-sensitive recording medium is comprised of a continuous photo-sensitive recording web wound into a roll, said photo-sensitive recording web unwound from said roll being transported along said predetermined traveling path passing through the nip between said pair of pressurizing and developing rollers.

48. The image recording apparatus according to claim 16, further comprising a pair of pressurizing and developing rollers defining therebetween a nip, and means for defining a predetermined traveling path along which a photo-sensitive recording medium travels, said second predetermined transport path extending through the nip between said pair of pressurizing and developing rollers which are arranged upstream of said pair of heat-treatment roller with reference to a transport direction of the developing sheet along said second predetermined transport path, wherein said predetermined traveling path, along which said photo-sensitive recording medium travels, extends through the nip between said pair of pressurizing and developing rollers, said photo-sensitive recording medium having carried thereon a latent image, wherein said photosensitive recording medium having carried thereon said latent image and said developing sheet are caused to pass through the nip between said pair of pressurizing and developing rollers, with said photo-sensitive recording medium and said developing sheet superposed upon each other, wherein said pair of pressurizing and developing rollers cooperate with each other to apply pressure to said photo-sensitive recording medium and said developing sheet caused to pass through the nip between said pressurizing and developing rollers, to develop said latent image on said photo-sensitive recording medium, onto said developing sheet, wherein said developing sheet having carried thereon the developed image is caused to pass through the nip between said heat-treatment rollers, and said pair of heat-treatment rollers cooperate with each other to fix the image on said developing sheet caused to pass through the nip between said heat-treatment rollers.

49. The image recording apparatus according to claim 48, wherein said developing sheet having carried thereon the fixed image is utilized as said image sheet of the article to be inserted through the first-mentioned external insertion opening.

50. The image recording apparatus according to claim 48, wherein said photo-sensitive recording medium is comprised of a continuous photo-sensitive recording web wound into a roll, said photo-sensitive recording web unwound from said roll being transported along said predetermined traveling path passing through the nip between said pair of pressurizing and developing rollers.

51. The image recording apparatus according to claim 50, further comprising an exposure station arranged upstream of the nip between said pair of pressurizing and developing rollers with reference to a traveling direction of said photo-sensitive recording web along said predetermined traveling path, said exposure station including a platen on which an original having image information is set, and exposure means for exposing the original on said platen to form said latent image corresponding to the image information on the original, onto a longitudinal portion of said photo-sensitive recording web.

52. The image recording apparatus according to claim 51, wherein said exposure station further includes a contact-plate means movable between an operative position where said contact-plate means urges said original against said platen to bring said original into close contact with said platen, and an inoperative position where said contact-plate means is spaced from said platen, and drive means for moving said contact-plate means between said operative and inoperative positions.

53. The image recording apparatus according to claim 52, further comprising a frame fixedly mounted within said housing, said contact-plate means being hung from said frame for movement between said operative and inoperative positions, and operating means operatively connected to said contact-plate means for moving the same between said operative and inoperative positions relatively to said frame.

54. The image recording apparatus according to claim 53, wherein said operating means comprises an operating lever plate supported by said frame for reciprocative movement relative thereto, said operating lever plate being formed therein with cam-groove means, and an operating lever for reciprocatively moving said operating lever plate, said contact-plate means having pin means fitted in said cam-groove means, and wherein said cam-groove means has such a cam configuration that reciprocative movement of said operating lever plate by said operating lever causes said contact-plate means to be moved between said operative and inoperative positions.

55. An image recording apparatus wherein a latent image on a recording medium is developed onto a developing sheet to record an image corresponding to said latent image, onto said developing sheet, which comprises:
   a pair of pressurizing and developing rollers defining therebetween a nip through which a predetermined transport path extends, the developing sheet being transported along said predetermined transport path, wherein said recording medium having carried thereon said latent image and said developing sheet are caused to pass through said nip between said pair of pressurizing and developing rollers, with said recording medium and said developing sheet superposed one upon the other, and said pair of pressurizing and developing rollers cooperate with each other to apply pressure to said recording medium and said developing sheet caused to pass through said nip between said pressurizing and developing rollers, to develop said latent image on said recording medium, onto said developing sheet;
   a pair of heat-fixing rollers defining therebetween a nip through which said predetermined transport path extends, wherein said developing sheet having carried thereon the developed image is caused to pass through the nip between said pair of heat-fixing rollers, and said pair of heat-fixing rollers cooperate with each other fix the image on said developing sheet; and
   heat-insulating means arranged between said pair of pressurizing and developing rollers and said pair of heat-fixing rollers, for insulating radiation of heat from said pair of heat-fixing rollers to said pair of pressurizing and developing rollers, said heat-insulating means has an opening, and said predetermined transport path extending from the nip between said pair of pressurizing and developing rollers toward the nip between said pair of heat-fixing rollers extends through said opening; and
   a pair of backup rollers associated respectively with said pair of pressurizing and developing rollers, and urging means for urging at least one of said pair of backup rollers against one of said pair of pressure developing rollers associated with the one backup roller, for applying the pressure to said recording medium and said developing sheet caused to pass through said nip between said pair of pressurizing and developing rollers;
   wherein one of said backup rollers is rotatable about its own axis and is movable toward and away from one of said pair of pressurizing and developing rollers associated with the one backup roller, while the other backup roller is rotatable about its own axis, but is immovable toward and away from the other pressurizing and developing roller.

56. The image recording apparatus according to claim 55, wherein said urging means comprises a pivot having an axis extending parallel to the axes of the respective pressurizing and developing rollers, a lever on which the one backup roller is mounted for rotation about its own axis, said lever being mounted on said pivot for angular movement about the axis of said pivot, and spring means biasing said lever to urge the one backup roller against the one pressurizing and developing roller.

57. The image recording apparatus according to claim 56, wherein said lever has one end mounted on said pivot and the other end with which said spring means is associated, the one backup roller being mounted on said lever at a location between the one and other ends of said lever.

58. The image recording apparatus according to claim 57 wherein said urging means further comprises means for adjusting biasing force of said spring means.

* * * * *